US012577656B2

(12) United States Patent
Lenert et al.

(10) Patent No.: US 12,577,656 B2
(45) Date of Patent: Mar. 17, 2026

(54) TRANSPARENT MESOPOROUS MATERIALS AND DEVICES COMPRISING SAME

(71) Applicant: THE REGENTS OF THE UNIVERSITY OF MICHIGAN, Ann Arbor, MI (US)

(72) Inventors: Andrej Lenert, Ann Arbor, MI (US); Neil P. Dasgupta, Ann Arbor, MI (US); Zachary James Berquist, Ann Arbor, MI (US); Andrew Gayle, Ann Arbor, MI (US)

(73) Assignee: REGENTS OF THE UNIVERSITY OF MICHIGAN, Ann Arbor, MI (US)

( * ) Notice: Subject to any disclaimer, the term of this patent is extended or adjusted under 35 U.S.C. 154(b) by 280 days.

(21) Appl. No.: 18/010,978

(22) PCT Filed: Jun. 18, 2021

(86) PCT No.: PCT/US2021/038065
§ 371 (c)(1),
(2) Date: Dec. 16, 2022

(87) PCT Pub. No.: WO2021/257975
PCT Pub. Date: Dec. 23, 2021

(65) Prior Publication Data
US 2023/0235450 A1 Jul. 27, 2023

Related U.S. Application Data

(60) Provisional application No. 63/040,900, filed on Jun. 18, 2020.

(51) Int. Cl.
| | |
|---|---|
| *C23C 16/04* | (2006.01) |
| *C23C 16/40* | (2006.01) |
| *C23C 16/455* | (2006.01) |
| *F24S 80/52* | (2018.01) |
| *F24S 80/56* | (2018.01) |

(52) U.S. Cl.
CPC ............ *C23C 16/045* (2013.01); *C23C 16/40* (2013.01); *C23C 16/403* (2013.01); *C23C 16/45527* (2013.01); *F24S 80/52* (2018.05); *F24S 80/56* (2018.05)

(58) Field of Classification Search
None
See application file for complete search history.

(56) References Cited

U.S. PATENT DOCUMENTS

| | | | | |
|---|---|---|---|---|
| 2010/0178468 A1* | 7/2010 | Jiang | ..................... | B01D 67/009 |
| | | | | 427/535 |
| 2015/0228415 A1* | 8/2015 | Seok | ..................... | H01G 9/2031 |
| | | | | 136/256 |
| 2017/0229593 A1* | 8/2017 | Elam | ..................... | F24S 70/225 |
| 2019/0112704 A1 | 4/2019 | Sung et al. | | |

FOREIGN PATENT DOCUMENTS

| | | | | |
|---|---|---|---|---|
| JP | 2005306625 A | * | 11/2005 | |
| WO | WO-9112879 A1 | * | 9/1991 | |
| WO | WO 2011/125024 A1 | * | 10/2011 | ............... H01G 9/20 |

OTHER PUBLICATIONS

"Synthesis of Highly Ordered Hydrothermally Stable Mesoporous Niobia Catalysts by Atomic layer Deposition" YomairaJ. Pagan-Torres et al ; ACS Catalysis 2011, p. 1234-1245 (Year: 2011).*

Machine Translation of JP 2005306625 (Year: 2005).*

Pagan-Torres et al., Synthesis of highly ordered hydrothermally stable mesoporous niobia catalysts by atomic layer deposition, ACS Catalysis, 1(10):1234-45 (2011).

European Patent Application No. 21825563.6, Communication Pursuant to Rule 164(1) EPC, dated Jun. 27, 2024.

Beck et al., Scattering of visible light from silica aerogels, J. Phys. D Appl. Phys., 22(6):730-4 (1989).

Berquist et al., Plasmon-Enhanced Greenhouse Selectivity for High-Temperature Solar Thermal Energy Conversion, ACS Nano, 14(10):12605-13 (2020).

Dasgupta et al., Atomic layer deposition of Al-doped ZnO films: effect of grain orientation on conductivity, Chem. Mater., 22(16):4769-75 (2010).

Gordon et al., A kinetic model for step coverage by atomic layer deposition in narrow holes or trenches, Chem. Vap. Deposition, 9(2):73-8 (2003).

Heinemann et al., Radiation-conduction interaction: an investigation on silica aerogels, Int. J. Heat Mass Transf., 39(10):2115-30 (1996).

International Application No. PCT/US2021/038065, International Search Report and Written Opinion, mailed Nov. 26, 2021.

Kucheyev et al., Mechanisms of atomic layer deposition on substrates with ultrahigh aspect ratios, Langmuir, 24:943-8 (2008).

McEnaney et al., Aerogel-based solar thermal receivers, Nano Energy, 40:180-6 (2017).

Nordgaard et al., Modeling of flat-plate collectors based on silica aerogel, Solar Energy, 47(5):387-402 (1992).

Reim et al., Highly insulating aerogel glazing for solar energy usage, Solar Energy, 72(1):21-29 (2002).

Rinnerbauer et al., Metallic photonic crystal absorber-emitter for efficient spectral control in high-temperature solar themophotovoltaics, Adv. Energy Mater., 4(12):140034 (2014).

(Continued)

*Primary Examiner* — Callie E Shosho

(74) *Attorney, Agent, or Firm* — MARSHALL, GERSTEIN & BORUN LLP

(57) ABSTRACT

Thermally insulating materials (TIMs) for use in concentrated solar thermal (CST) technologies comprising a mesoporous oxide including a porous oxide matrix comprising a porous oxide and a metal oxide or metal nitride in the form of a conformal layer of the metal oxide or metal nitride on the surface of the porous oxide matrix, wherein the conformal layer completely covers the surface area of the porous oxide matrix, or in the form of metal oxide or metal nitride nanoparticles dispersed throughout the porous oxide matrix, or in the form of a conformal coating or nanoparticles, methods of preparing same, and solar devices comprising same.

17 Claims, 11 Drawing Sheets

(56)                    References Cited

OTHER PUBLICATIONS

Rubin et al., Transparent silica aerogels for window insulation, Solar Energy Materials, 7(4):393-400 (1983).

Strobach et al., High temperature annealing for structural optimization of silica aerogels in solar thermal applications, Journal of Non-Crystalline Solids, 462:72-7 (2017).

Strobach et al., High temperature stability of transparent silica aerogels for solar thermal applications, APL Materials, 7(8):081104 (2019).

Svendsen, Solar collector with monolithic silica aerogel, Journal of Non-Crystalline Solids, 145:240-3 (1992).

Weinstein et al., Concentrating solar polar, Chemical Reviews, 115(23):12797-838 (2015).

Zeng et al., Pore size distribution and apparent gas thermal conductivity of silica aerogel, J. Heat Transfer, 116(3):756-9 (1994).

Zeng et al., Theoretical modeling of carbon content to minimize heat transfer in silica aerogel, Journal of Non-Crystalline Solids, 186:271-7 (1995).

Zhao et al., Harnessing heat beyond 200° C from unconcentrated sunlight with non-evacuated transparent aerogels, ACS Nano, 13(7):7508-16 (2019).

Lee et al., Allucone alloys with tunable properties using alucone molecular layer deposition and $Al_2O_3$ atomic layer deposition, J. Phys. Chem. C, 116:3250-7 (2012).

Sarkar et al., $In_2S_3$ atomic layer deposition and its application as a sensitizer on $TiO_2$ nanotube arrays for solar energy conversion, J. Phys. Chem. C, 114:8032-9 (2010).

Akyildiz et al., Temperature and exposure dependence of hybrid organic-inorganic layer formation by sequential vapor infiltration into polymer fibers, Langmuir, 28:15697-704 (2012).

* cited by examiner

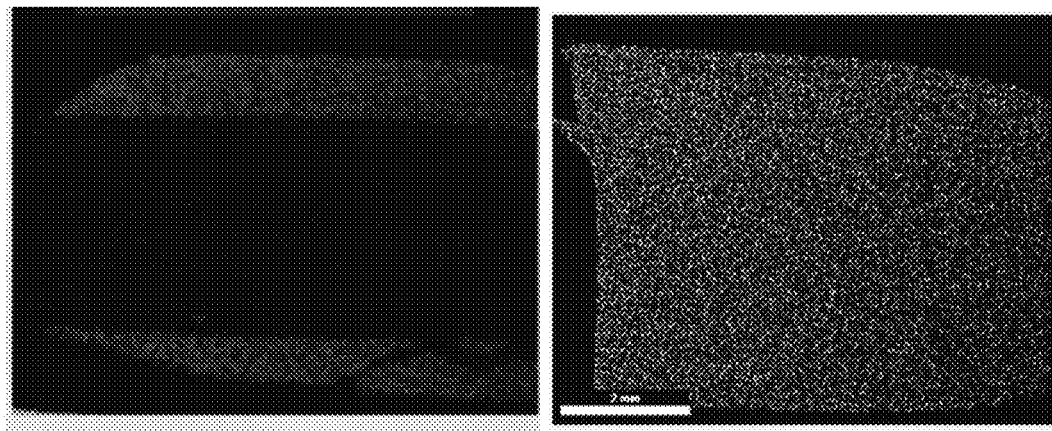
FIG. 1A                                    FIG. 1B
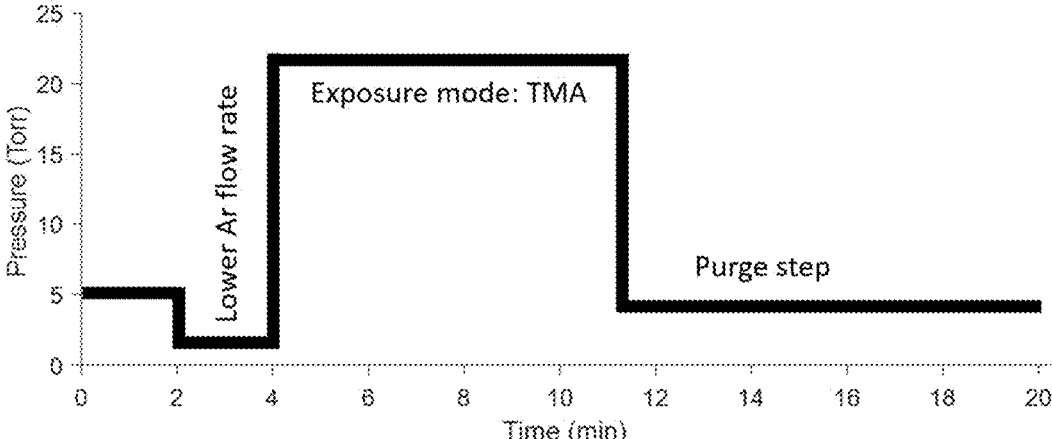
FIG. 2A
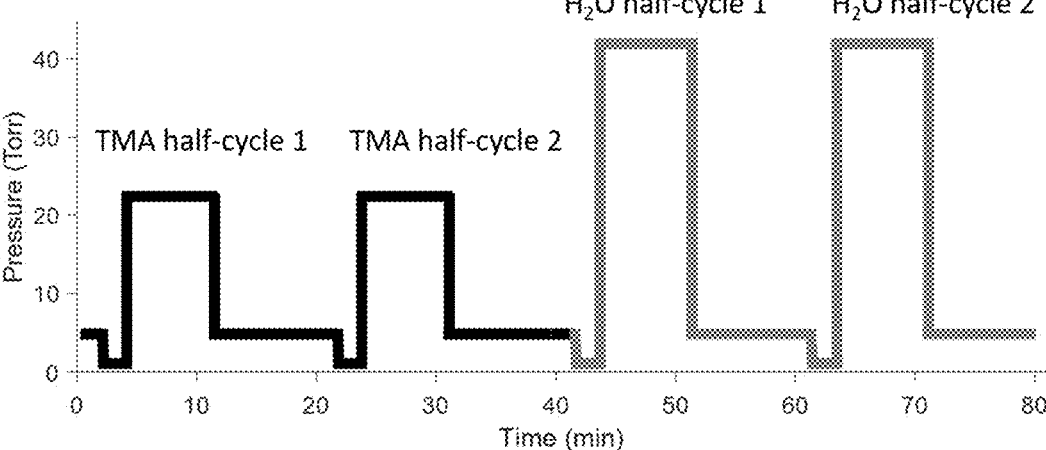
FIG. 2B

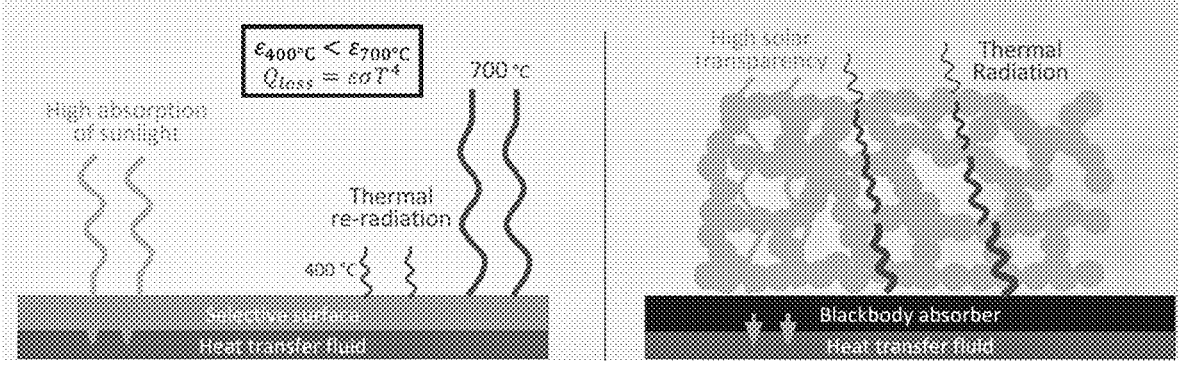
FIG. 3                                              FIG. 4
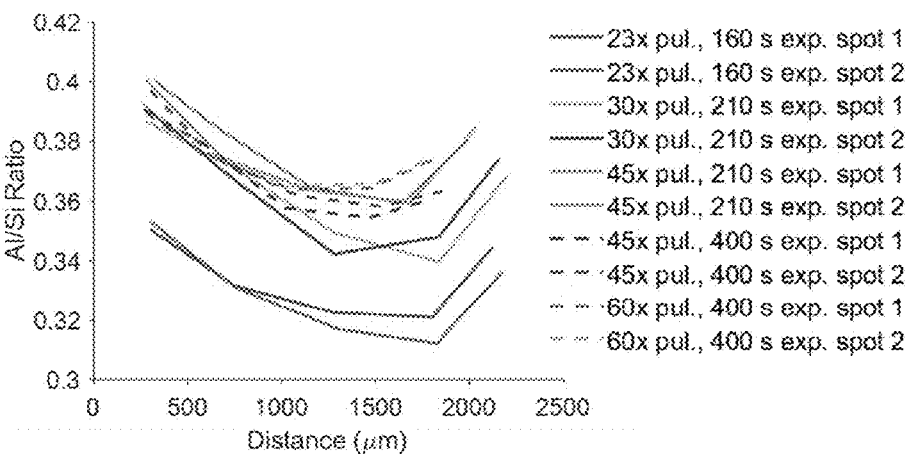
FIG. 5

FIG. 6A
FIG. 6B
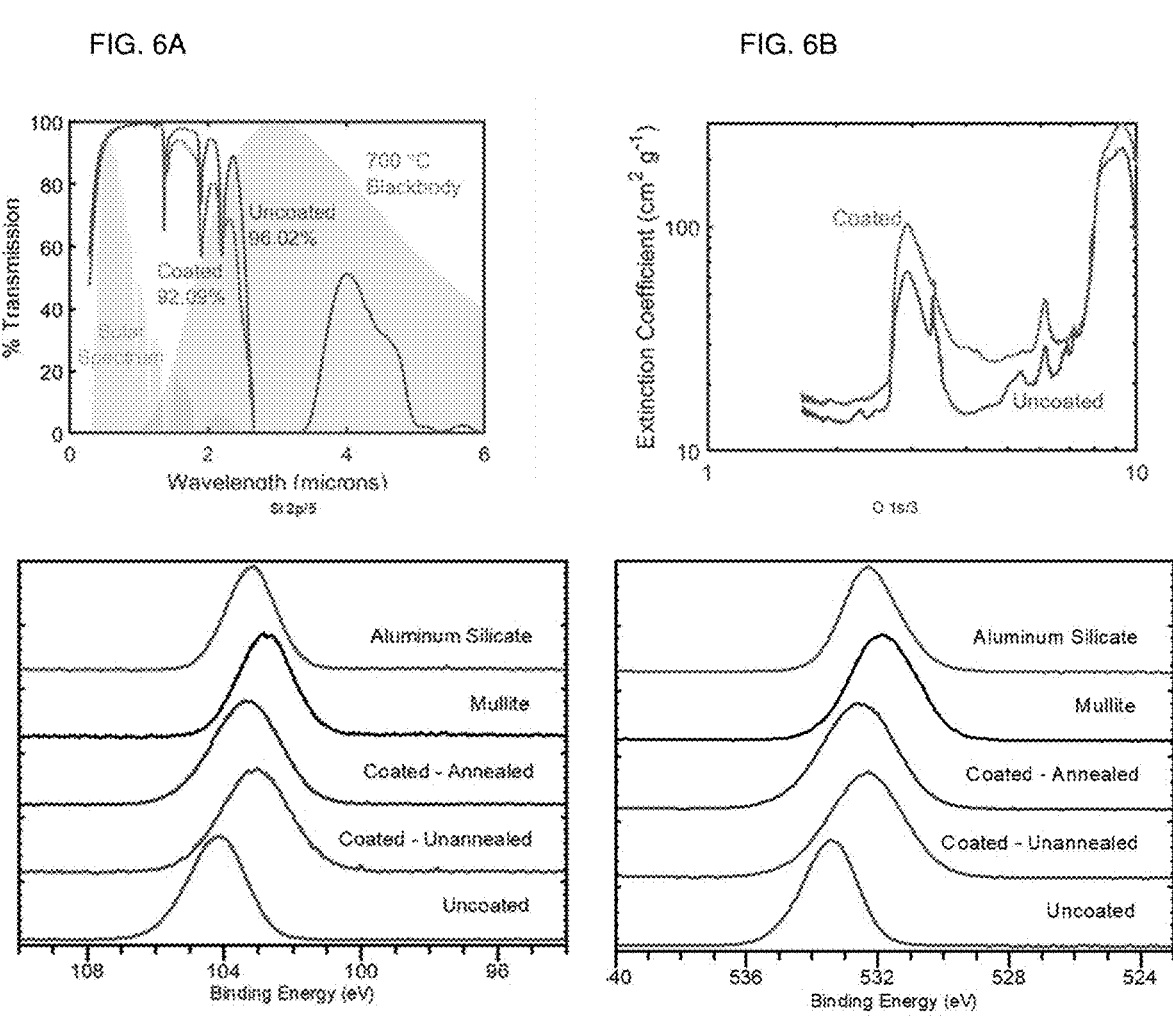
FIG. 6C
FIG. 6D
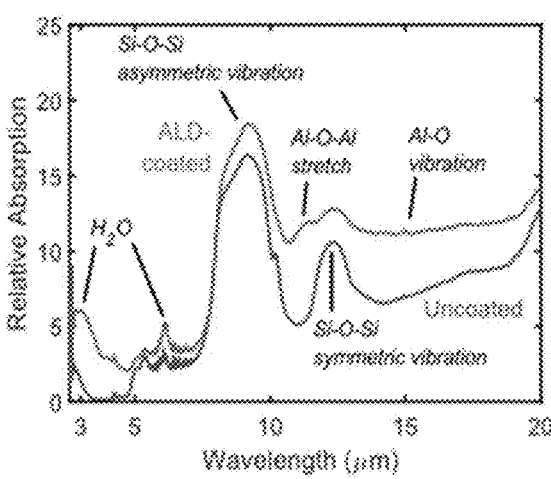
FIG. 6 E

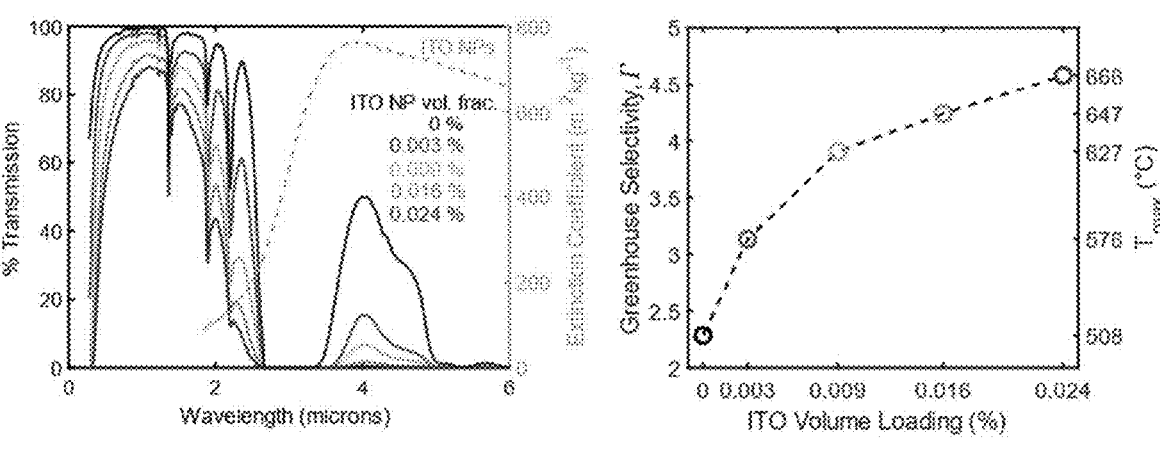
FIG. 9A                                          FIG. 9B
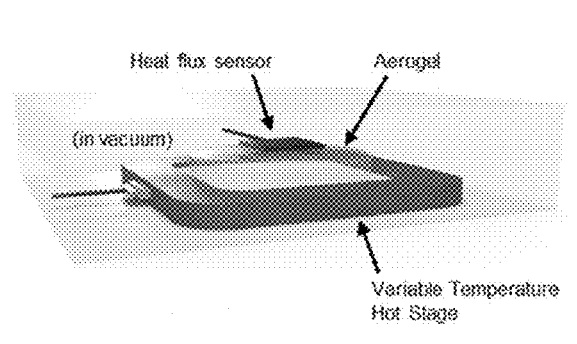
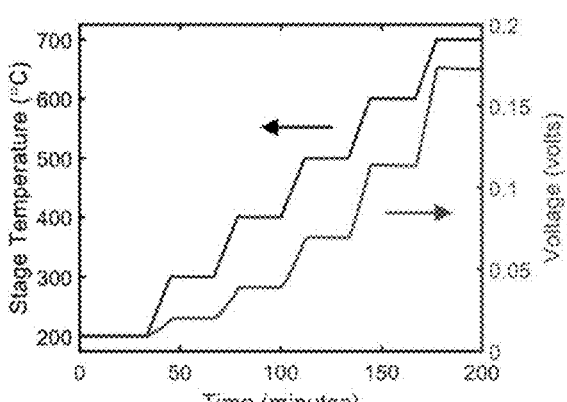
FIG. 10A                                         FIG. 10B
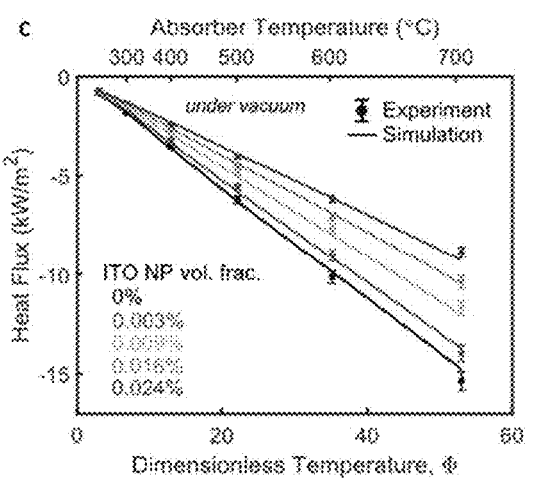
FIG. 10C

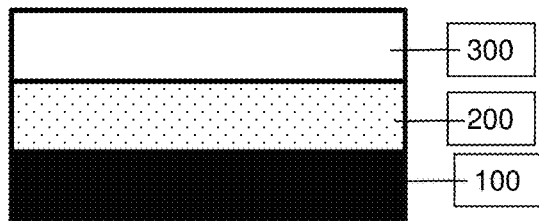
FIG. 11
FIG. 12A
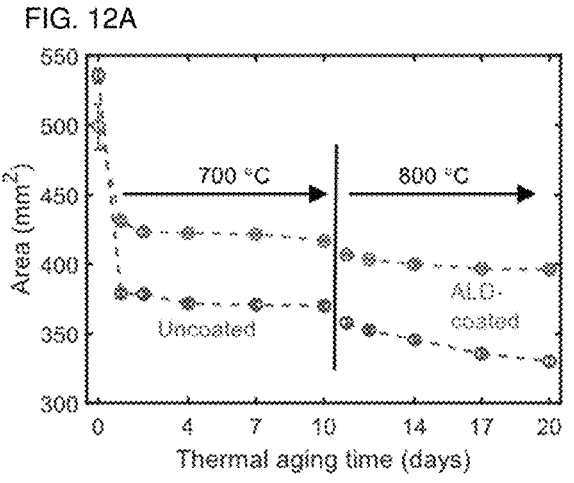
FIG. 12B
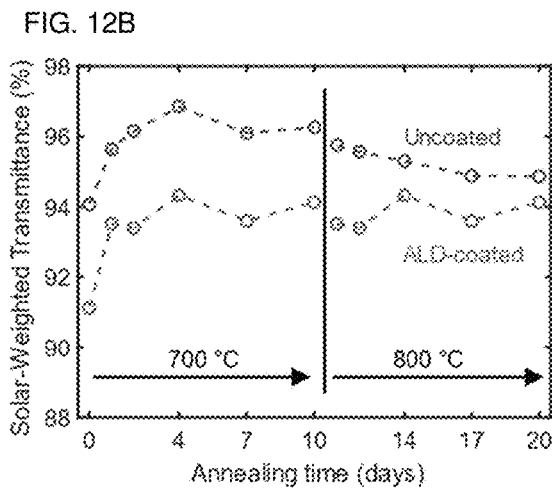

FIG. 13A
FIG. 13B
FIG. 13C
FIG. 13D
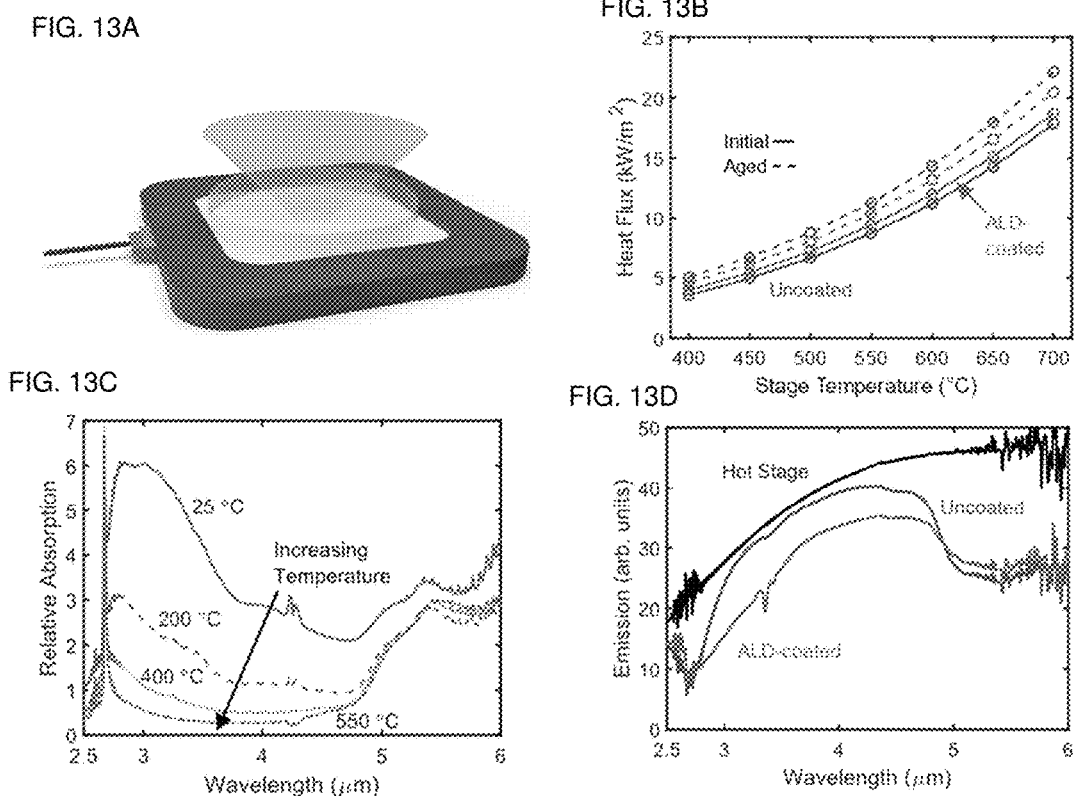
Exposure
Dose
Purge
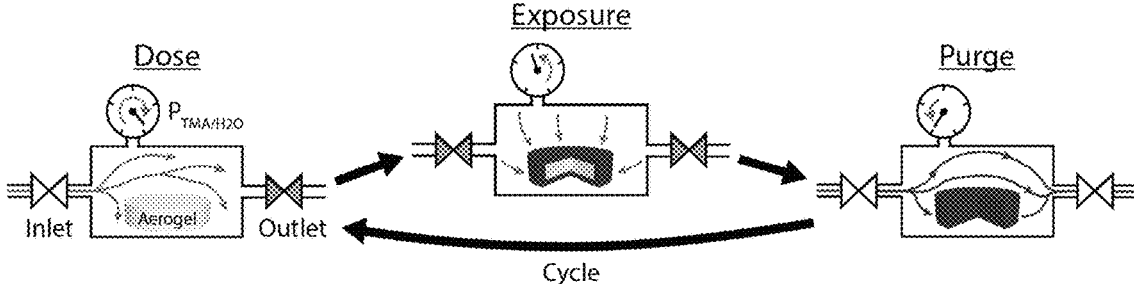
Cycle
FIG. 14

FIG. 18A
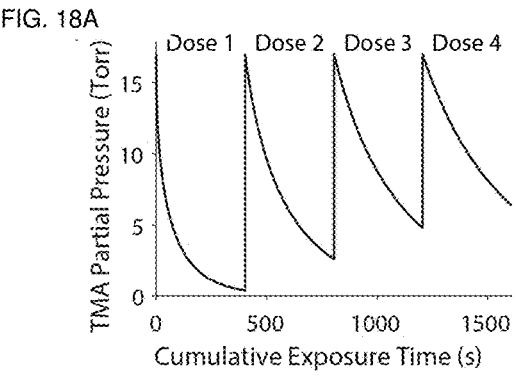
FIG. 18B
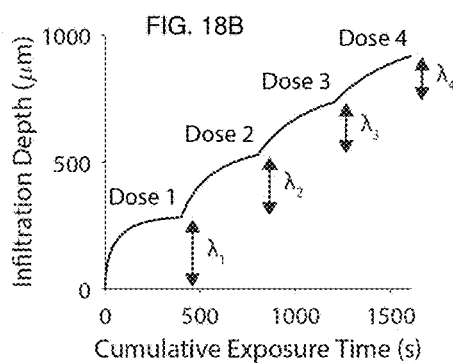
FIG. 18C     Varying Exp. Time (Constant No. Doses)
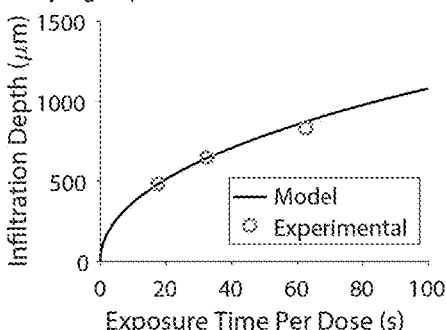
Varying No. Doses (Constant Exp. Time)
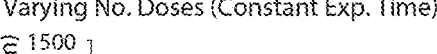
FIG. 18D
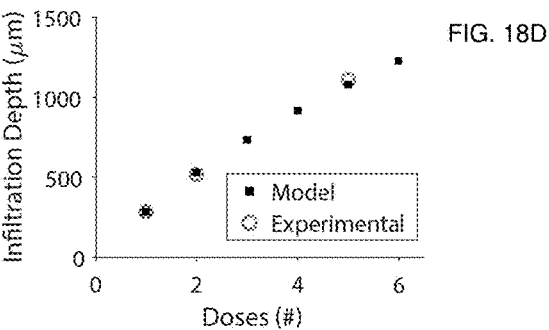
ALD Conditions for Infiltration of 1.25 mm
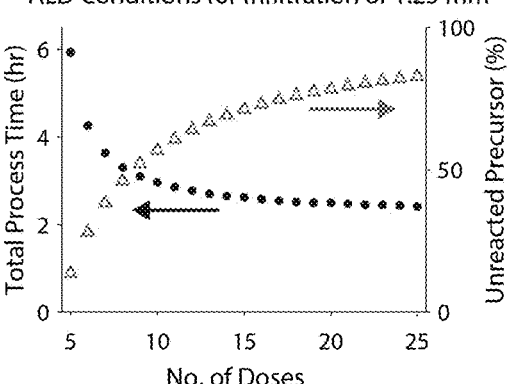
FIG. 19

TRANSPARENT MESOPOROUS MATERIALS AND DEVICES COMPRISING SAME

CROSS REFERENCE TO RELATED APPLICATIONS

This application is a National Stage application of International Application No. PCT/US21/38065, filed Jun. 18, 2021, which claims the benefit under 35 U.S.C. § 119 (e) of U.S. Provisional Application No. 63/040,900, filed Jun. 18, 2020, the entire disclosures of which are hereby incorporated by reference.

STATEMENT OF GOVERNMENT SUPPORT

This invention was made with government support under Contract No. DE-EE0008526, awarded by the Department of Energy. The government has certain rights in this invention.

FIELD OF THE DISCLOSURE

The present disclosure generally relates to transparent mesoporous oxides. More specifically, the present disclosure relates to transparent, highly porous materials having a porous oxide backbone matrix structure and a conformal coating of a metal oxide or metal nitride, a metal oxide or metal nitride nanoparticles dispersed throughout the porous oxide matrix, or both, and the use of same in solar power devices.

BACKGROUND

Concentrated solar thermal (CST) technologies are promising carbon-neutral methods to meet future energy demands in electricity generation and process heat. CST converts concentrated sunlight into thermal energy which can then be stored for overnight use, and thus provide baseload power. Current concentrated solar power (CSP) plants rely on steam Rankine cycles with ~42% efficiency to convert thermal energy stored at moderate temperatures (at or below 565° C.). Achieving temperatures greater than 700° C., however, would enable the use of high-efficiency power cycles, such as the supercritical carbon dioxide ($sCO_2$) Brayton cycle (~50% efficiency).

To reach these temperatures, solar concentration is needed. Typically, this is achieved using a field of a heliostats that reflect sunlight onto a stationary central receiver, also known as a "power tower" configuration. However, reaching high temperatures using line-focusing systems, instead of point-focusing systems, would offer distinct advantages. Specifically, line-focusing systems, such as linear Fresnel reflectors (LFRs) and parabolic trough collectors (PTCs), are relatively inexpensive and have higher optical efficiencies (80%). Nevertheless, there is a current lack a technology that would allow a linear receiver to convert focused sunlight into 700° C. heat with sufficiently high receiver efficiency.

To improve the performance of linear collectors, their absorber tubes typically have a solar selective coating. The main measure of solar absorber performance is the selectivity of its emittance towards solar absorptance compared to thermal emittance. In state-of-the-art heat-treated coatings, typical values for solar absorptance and thermal emittance are ~90% and ~30%, respectively. Although significant progress has been made, selective absorbers are fundamentally limited by degradation in selectivity at high temperatures due to increased parasitic infrared absorption, and in turn emission losses per Kirchhoff's law, associated with pronounced lattice vibrations. Furthermore, selective surfaces are difficult to stabilize at high temperatures because of surface oxidation and inter-layer diffusion.

Alternatively, transparent insulating materials (TIMs) with high solar transmission and high infrared absorption can effectively replace selective coatings. Materials with high infrared absorption limit thermal re-radiative losses by enforcing a diffusive pathway for thermal photons out of the receiver. Because a good TIM is selectively transparent, it can be used efficiently with broadband (i.e. blackbody) absorbers that demonstrate higher thermal stability.

The leading TIM for CST is high-porosity mesoporous silica (e.g., silica aerogels) because of their high solar transparency, high far-infrared absorption, and low thermal conductivity. However, there are two shortcomings of silica aerogels that limits their practicality in next-generation 700° C. CSP designs. First, silica aerogels suffer from large re-radiative losses at elevated temperatures due to their infrared transparency window at wavelengths below 5 μm. The transparency window becomes more pronounced at elevated temperatures due to reaction of hydroxyl groups and desorption of water. The resulting impact on efficiency is large because ~63% of blackbody emitted power at 700° C. lies below 5 μm. Second, silica aerogels are thermally unstable at temperatures above 600° C. The size of the aerogel monolith shrinks indefinitely due to the densification of nanometer-scale silica particles, degrading its insulation properties.

Accordingly, there is a need in the art to provide a TIM for CST that is thermally stable at high temperatures, has high solar transparency, has high infrared absorption at high temperatures, and has low thermal conductivity.

SUMMARY

One aspect of the disclosure provides a mesoporous oxide including a porous oxide matrix and a metal oxide or metal nitride, wherein the metal oxide or metal nitride is in the form of metal oxide or metal nitride nanoparticles distributed throughout the porous oxide matrix, wherein the porous oxide is not the same as the metal oxide.

Another aspect of the disclosure provides a mesoporous oxide including a porous oxide matrix including a porous oxide and having a surface area, and a metal oxide or metal nitride in the form of a conformal layer of the metal oxide or metal nitride on a surface region of the porous oxide matrix, wherein the conformal layer completely covers the surface area of the surface region of porous oxide matrix and wherein the porous oxide is not the same as the metal oxide.

Another aspect of the disclosure provides a mesoporous oxide including a porous oxide matrix and a metal oxide or metal nitride, wherein the metal oxide or metal nitride is (1) in the form of a conformal layer of the metal oxide or metal nitride on the surface of the porous oxide matrix and the conformal layer completely covers the porous oxide through a thickness of the matrix, and (2) in the form of metal oxide or metal nitride nanoparticles distributed throughout the porous oxide matrix, wherein the porous oxide is not the same as the metal oxide.

Another aspect of the disclosure provides a method of preparing a mesoporous oxide, the method including depositing a metal oxide or metal nitride onto a porous oxide matrix, wherein the porous oxide is not the same as the metal oxide. Depositing the metal oxide or metal nitride onto the porous oxide matrix can include atomic-layer deposition (ALD), the ALD can include a first precursor half-cycle and a second precursor half cycle, wherein the first precursor half-cycle includes contacting the porous matrix with a first precursor material and the second precursor half-cycle includes contacting the porous matrix with a second precursor material, and wherein the first precursor half cycle is performed two or more times sequentially and the second precursor half cycle is performed two or more times sequentially, and wherein the porous oxide is not the same as the metal oxide.

Another aspect of the disclosure provides a solar receiver, including a solar absorber layer, a window layer, and a mesoporous oxide layer disposed between the solar absorber layer and the window layer. The mesoporous oxide layer can include a porous oxide matrix and a metal oxide or metal nitride, wherein the metal oxide or metal nitride is (1) in the form of a conformal layer of the metal oxide or metal nitride on the surface of the porous oxide matrix and the conformal layer completely covers the porous oxide through a thickness of the matrix, (2) in the form of metal oxide or metal nitride nanoparticles distributed throughout the porous oxide matrix, or (3) a combination of (1) and (2), wherein the porous oxide is not the same as the metal oxide.

Additional aspects and advantages will become apparent to those of ordinary skill in the art from a review of the following description. While the materials and devices and their methods of making are susceptible of embodiments in various forms, the description hereafter includes specific embodiments with the understanding that the disclosure is illustrative and is not intended to limit the invention to the specific embodiments described herein.

DESCRIPTION OF THE DRAWINGS

For further facilitating the understanding of the present disclosure twenty (20) drawing figures are appended hereto.

FIG. 1A illustrates a non-ideal atomic layer deposition (ALD) deposition of a metal oxide or metal nitride that does not cover the entire surface of the porous oxide matrix and does not penetrate across a thickness of the porous oxide matrix. A qualitative color map of aluminum atomic concentration in a cross-section is measured using scanning electron microscopy (SEM) energy-dispersive x-ray spectroscopy (EDS).

FIG. 1B illustrates a mesoporous oxide of the disclosure including a porous oxide matrix having a metal oxide or metal nitride coated on the surface of the metal oxide that penetrates the thickness of the porous oxide matrix, according to embodiments of the disclosure. The aluminum atomic concentration is measured using SEM-EDS.

FIG. 2A illustrates an example pressure profile for one half-cycle of ALD.

FIG. 2B illustrates an example pressure profile in a modified ALD exposure mode, according to embodiments of the disclosure.

FIG. 3 illustrates a prior art absorber including a selective surface that transmits sunlight but has high amounts of thermal re-radiation at high temperatures.

FIG. 4 illustrates an absorber of the disclosure including a blackbody absorber and a mesoporous oxide layer that has high solar transparency and low thermal re-radiation, in accordance with embodiments of the disclosure.

FIG. 5 illustrates the dependence of the Al/Si ratio for a porous silica matrix coated with aluminum by ALD, on the distance from the matrix surface, number of half cycles, and exposure time.

FIG. 6A illustrates the effect of an alumina coating on the infrared transparency window of silica aerogels, in accordance with embodiments of the disclosure, measured at room temperature (about 20-25° C.).

FIG. 6B illustrates the effect of a metal oxide coating on the extinction coefficient of silica aerogels within the transparency window of silica aerogels, according to embodiments of the disclosure.

FIG. 6C illustrates the XPS Si 2p binding energy of various materials having a silica aerogel matrix, and comparative crystalline aluminum-silicate materials.

FIG. 6D illustrates the XPS O 1s binding energy of various materials having a silica aerogel matrix, and comparative crystalline aluminum-silicate materials.

FIG. 6E illustrates the effect of a metal oxide coating on the absorption from water between 3-5 microns as a result of increased hydrophilicity from the coating, according to embodiments of the disclosure.

FIG. 9A illustrates the effect of nanoparticle volume fraction on the transmission of light over various wavelengths for mesoporous oxides of the disclosure.

FIG. 9B illustrates the effect of nanoparticle volume fraction on greenhouse selectivity for mesoporous oxides of the disclosure.

FIG. 10A illustrates the experimental setup used to measure heat flux.

FIG. 10 B illustrates the relationship of the recorded voltage to the stage temperature in the heat flux setup.

FIG. 10C illustrates experimental (points) and simulated (solid lines) temperature dependent heat losses with increasing nanoparticle loading in the mesoporous oxides according to the disclosure.

FIG. 11 illustrates a solar receiver comprising a solar absorber layer (100), a window layer (300), and a mesoporous oxide layer (200) disposed between the solar absorber layer (100) and the window layer (300), according to embodiments of the disclosure.

FIG. 12A illustrates the thermal stability of mesoporous oxides of the disclosure (coated) and uncoated silica aerogels based on cross-sectional area measurements.

FIG. 12B illustrates the thermal stability of mesoporous oxides of the disclosure (coated) and uncoated silica aerogels based on the solar-weighted transmittance.

FIG. 13A is a schematic showing the aerogel samples filter the emission from the hot stage before it reaches the heat flux sensor or FTIR detector.

FIG. 13B illustrates the heat flux through mesoporous oxides of the disclosure (ALD-coated) and uncoated silica aerogels before and after aging. The heat flux through the aged ALD-coated aerogel only increases 9.5% at 700° C.

after aging compared to 24.1% for the uncoated aerogel. Error bars are omitted for clarity but are all within 3% of experimental values.

FIG. 13C illustrates the temperature-dependent diffuse reflectance infrared Fourier transform spectroscopy (DRIFTS) for mesoporous oxides of the disclosure. The desorption of water from the aerogels at high temperatures decreases absorption within the infrared transparency window.

FIG. 13D illustrates relative emission measurements at 650° C. in a nitrogen atmosphere for mesoporous oxides of the disclosure (ALD-coated) and uncoated aerogels. The ALD-coated aerogel suppresses thermal radiation within the uncoated aerogel's infrared transparency window (3-5 μm) indicating adsorbed water plays a major role in the heat transfer.

FIG. 14 is an illustration of a schematic of the reactor conditions during a quasi-static mode (QSM) ALD coating process.

Figure 15:
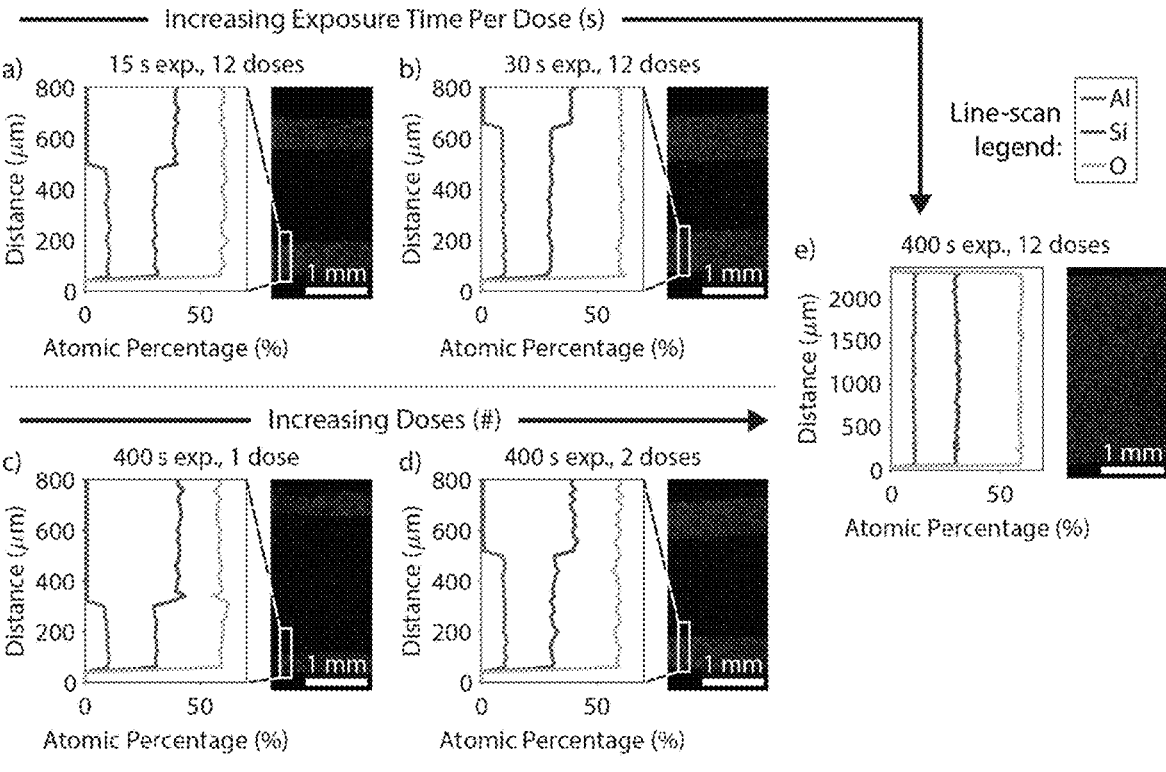

FIG. 15 illustrates the infiltration of the ALD precursors into the aerogel when varying exposure time per dose while holding fixed 12 precursor doses and varying the number of precursor doses while holding fixed 400 s of exposure time per dose to arrive at a conformally coated aerogel of the disclosure. Infiltration is measured by SEM/EDS, using both elemental concentration mapping and line scans.

Figure 16:
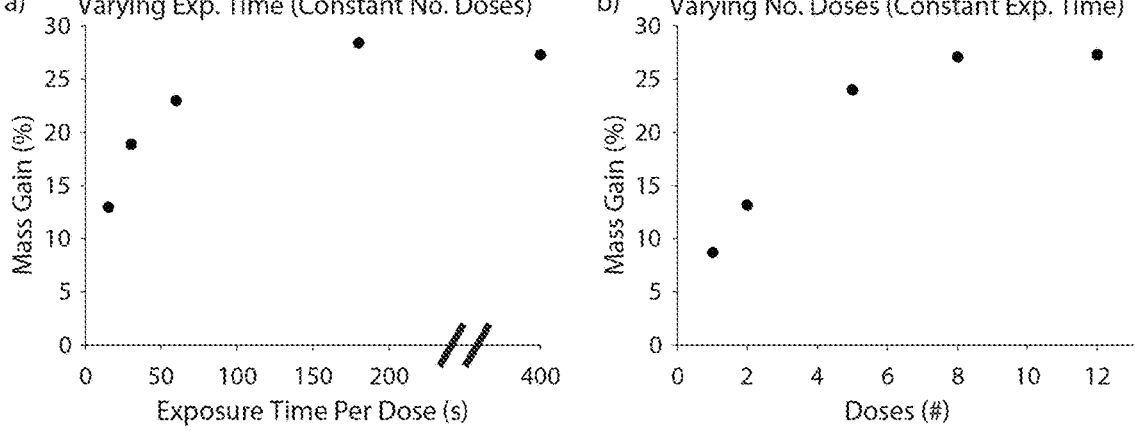

FIG. 16 illustrates the mass gain (%) relative to the initial, uncoated aerogel mass when the exposure time per dose using 12 precursor doses of TMA and DI water was varied and when the number of precursor doses using 400 s of exposure time per dose were varied.

Figure 17:
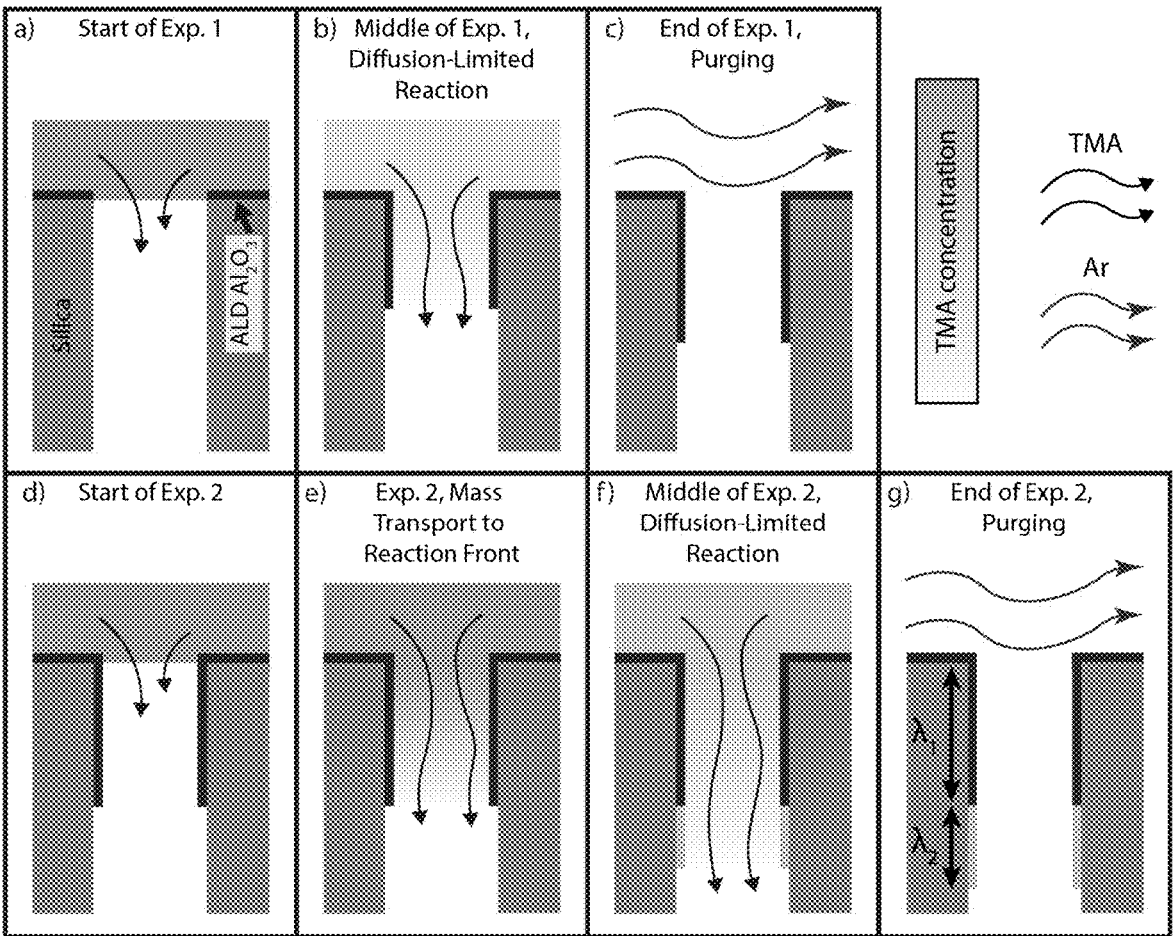

FIG. 17 is a schematic visualization of the first two multi-dose QSM steps for the ALD method of the disclosure, showing a single, straight pore for clarity.

FIG. 18A is an illustration of modeled TMA partial pressure in the reaction chamber during a multi-dose QSM ALD process of the disclosure.

FIG. 18B is an illustration of ALD infiltration depth with respect to cumulative exposure time for a multi-dose QSM ALD process of the disclosure using 4 doses of TMA and an exposure time per dose of 400 s.

FIG. 18C is an illustration of ALD infiltration depth using 12 TMA doses with varying exposure times per dose for a multi-dose QSM ALD process of the disclosure.

FIG. 18D is an illustration of ALD infiltration depth for a varying number of TMA doses, each with an exposure time per dose of 400 s for a multi-dose QSM ALD process of the disclosure.

FIG. 19 illustrates ALD process efficiency tradeoffs using the multi-dose QSM model of the disclosure.

Figures 20A, 20B, 20C, 20D:
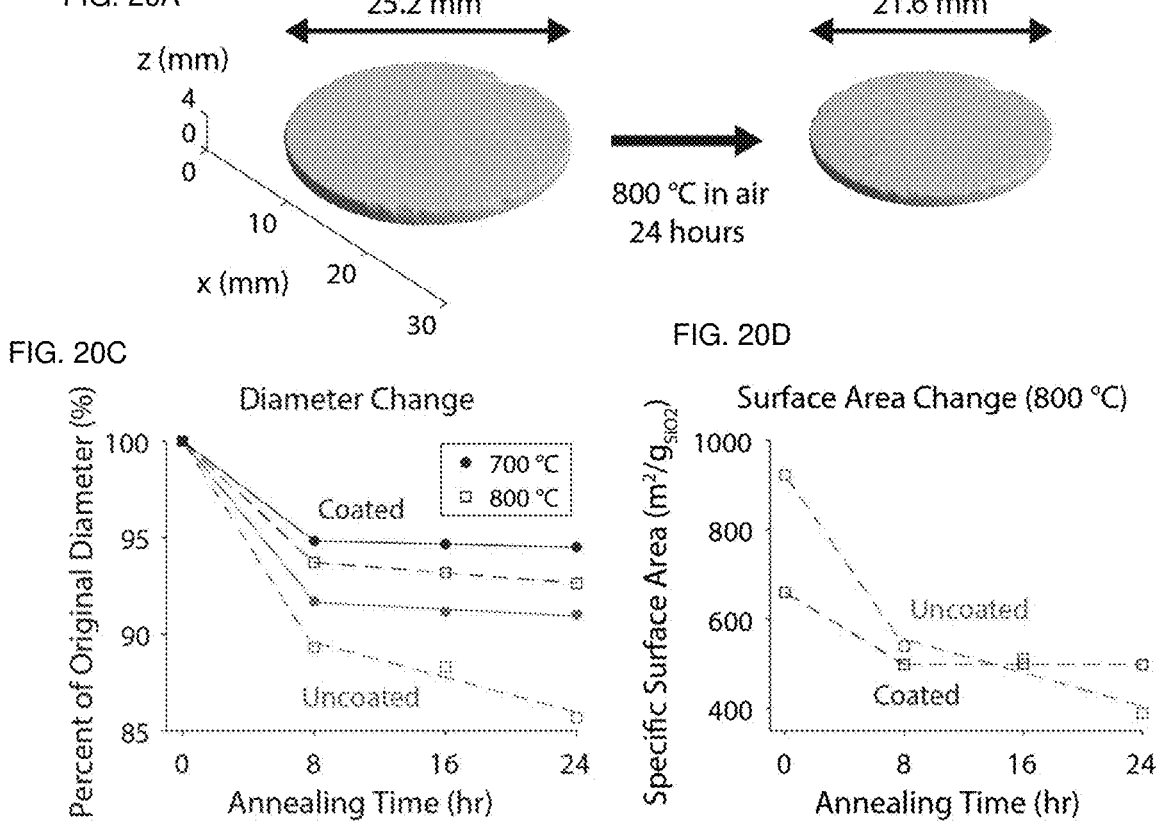

FIG. 20A illustrates an uncoated aerogel before high-temperature annealing.

FIG. 20B illustrates an uncoated aerogel after annealing at 800° C. in air for 24 hours.

FIG. 20C illustrates the change in the normalized average aerogel diameter with annealing time in uncoated samples and mesoporous oxides of the disclosure (coated).

FIG. 20D illustrates the change in specific surface area (per gram of silica) with respect to annealing time at 800° C. in uncoated samples and mesoporous oxides of the disclosure (coated).

DETAILED DESCRIPTION

The disclosure provides thermally insulating materials (TIMs) for use in concentrated solar thermal (CST) technologies. Advantageously, the TIMs of the disclosure provide one or more benefits, including but not limited to, having high solar transparency, high infrared absorption at high temperatures, low thermal conductivity and/or thermal stability at high temperatures. The thermally insulating materials of the disclosure are generally mesoporous oxides having a porous oxide matrix backbone structure and a metal oxide or a metal nitride, wherein the porous oxide is not the same as the metal oxide. As used herein, and unless specified otherwise, the term "mesoporous oxide" refers to the TIM structure including a porous oxide matrix backbone and a metal oxide or metal nitride, i.e., a porous oxide matrix conformally coated with a metal oxide or metal nitride.

The mesoporous oxides, porous oxides, metal oxides, metal nitrides, and related articles and methods of making and using are contemplated to include embodiments including any combination of one or more of the elements, features, and steps further described below (including those shown in the figures and any examples), unless stated otherwise.

"Comprising" as used herein means that various components, ingredients or steps that can be conjointly employed in practicing the present disclosure. Accordingly, the term "comprising" encompasses the more restrictive terms "consisting essentially of" and "consisting of." The present compositions can comprise, consist essentially of, or consist of any of the required and optional elements disclosed herein. The disclosure illustratively disclosed herein suitably may be practiced in the absence of any element or step which is not specifically disclosed herein.

All measurements made are at about 25° C., unless otherwise specified.

All ranges set forth herein include all possible subsets of ranges and any combinations of such subset ranges. By default, ranges are inclusive of the stated endpoints, unless stated otherwise. Where a range of values is provided, it is understood that each intervening value between the upper and lower limit of that range and any other stated or intervening value in that stated range, is encompassed within the disclosure. The upper and lower limits of these smaller ranges may independently be included in the smaller ranges, and are also encompassed within the disclosure, subject to any specifically excluded limit in the stated range. Where the stated range includes one or both of the limits, ranges excluding either or both of those included limits are also contemplated to be part of the disclosure.

It is expressly contemplated that for any number value described herein, e.g. as a parameter of the subject matter described or part of a range associated with the subject matter described, an alternative which forms part of the description is a functionally equivalent range surrounding the specific numerical value (e.g. for a dimension disclosed as "40 nm" an alternative embodiment contemplated is "about 40 nm").

In general, the porous oxide matrix of the disclosure can be any porous oxide matrix having a backbone comprising a metal oxide. In embodiments, the porous oxide is stable at temperatures of at least about 400° C., for example, in a range of about 400° C. to about 1000° C., about 500° C. to about 900° C., about 600° C. to about 800° C., or about 700° C., for example, about 400° C., about 500° C., about 600° C., about 700° C., about 800° C., about 900° C., or about 1000° C. In embodiments, the porous oxide is stable at a temperature of about 400° C. In embodiments, the porous oxide is stable at a temperature of about 600° C. In embodiments, the porous oxide is stable at a temperature of about 700° C. In embodiments, the porous oxide comprises a transparent porous oxide. In embodiments, the porous oxide comprises silicon dioxide ($SiO_2$), aluminum oxide ($Al_2O_3$), chromium oxide ($Cr_2O_3$), tin dioxide ($SnO_2$), sodium oxide ($Na_2O$), calcium oxide (CaO), lithium oxide ($Li_2O$), magnesium oxide (MgO), zinc oxide (ZnO), manganese oxide (MnO), cobalt oxide (CoO), indium oxide ($In_2O_3$), antimony oxide ($Sb_2O_3$), or a combination thereof. In embodiments, the porous oxide comprises silicon dioxide ($SiO_2$), aluminum oxide ($Al_2O_3$), or a combination thereof. In embodiments, the porous oxide comprises silicon dioxide. In embodiments, the porous oxide matrix can be in the form of an aerogel, for example a silica or other aerogel. The term "aerogel" is used herein in accordance with the IUPAC definition of "a gel comprising a microporous and mesoporous solid in which the dispersed phase is a gas."

In embodiments, the porous oxide can be replaced with a polymeric aerogel having a porosity or thickness as disclosed herein for the porous oxide. It will be understood that polymeric aerogels are not typically thermally stable under the CST conditions described herein; however, such polymeric aerogels and TIMs prepared therefrom including a metal oxide or metal nitride of the disclosure can find utility in applications such as window coverings.

In embodiments, the porous oxide and the mesoporous oxide of the disclosure can have any pore size provided that the porous oxide and resulting mesoporous oxide remain transparent to incident solar radiation and provided that the pores will not become blocked upon coating the matrix backbone with the metal oxide or metal nitride such that the conformal coating cannot penetrate the full depth of the matrix backbone. As used herein, and unless specified otherwise, a porous oxide, mesoporous oxide, metal oxide, or metal nitride is "transparent to incident solar radiation," or more generally, "transparent" if the material has a solar-weighted transmittance of at least 65% over the AM1.5D standard spectrum. The AM1.5D standard spectrum is the accepted standard for the solar industry for testing or rating solar cells.

In embodiments, the porous oxide and the resulting mesoporous oxide can have a pore size of 100 nm or less, or 50 nm or less, for example, in a range of about 2 nm to about 100 nm, about 2 nm to about 50 nm, about 2 nm to about 30 nm, about 5 nm to about 90 nm, about 5 nm to about 50 nm, about 5 nm to about 30 nm, about 10 nm to about 85 nm or about 10 nm to about 40 nm, about 20 nm to about 80 nm, about 30 nm to about 80 nm, about 40 nm to about 80 nm, or about 50 nm to about 80 nm. The foregoing size ranges can represent an average pore size (e.g., volume- or number-based average) and/or upper and lower boundaries of a pore size distribution (e.g., 10%/90%, 5%/95%, 1%/99% cumulative sizes for a volume- or number-based size distribution).

In embodiments, the porous oxide and the resulting mesoporous oxide can be amorphous. In embodiments, the porous oxide and the resulting mesoporous oxide can be crystalline with chains cross-linked together.

In general, the metal oxide or metal nitride of the disclosure can be any semiconductor or conductor that is transparent to incident solar radiation. In embodiments, the metal oxide or metal nitride is a transparent semiconductor or transparent conductor. In embodiments, the metal oxide or metal nitride is a transparent semiconductor. In embodiments, the metal oxide or metal nitride is a transparent conductor. As used herein, and unless specified otherwise, references to "semiconductor(s)" and "conductor(s)" refer to electrical conductivity. In embodiments, the metal oxide or metal nitride can include aluminum oxide ($Al_2O_3$), indium oxide ($In_2O_3$), zinc oxide (ZnO), titanium dioxide ($TiO_2$), titanium oxide ($Ti_2O_3$), titanium nitride (TiN), tin dioxide ($SnO_2$), magnesium oxide (MgO), calcium oxide (CaO), indium oxide ($In_2O_3$), antimony oxide ($Sb_2O_3$), hafnium dioxide ($HfO_2$), zirconium dioxide ($ZrO_2$), chrome ($Cr_2O_3$) or a combination thereof. In embodiments, the metal oxide can include aluminum oxide ($Al_2O_3$). The foregoing metal oxide stoichiometries are exemplary, however it will be understood that when the coating is very thin, it is difficult to assign a specific stoichiometry. In embodiments, the metal oxide or metal nitride can be a doped metal oxide or metal nitride. In embodiments, the metal oxide or metal nitride can be degenerately doped. In embodiments, the metal oxide or metal nitride can include a dopant selected from the group consisting of zinc, indium, tin, antimony, titanium, or a combination thereof.

In general the porous oxide is different from the metal oxide. As used herein, a porous oxide is different from a metal oxide if the porous oxide has a different chemical makeup than the metal oxide and does not include only a difference in polymorph. In embodiments, the porous oxide has a different metal element/combination of metal elements than the metal oxide. In embodiments, the porous oxide comprises $SiO_2$ and the metal oxide comprises aluminum oxide, zirconium dioxide, titanium dioxide, titanium oxide, and chrome. In embodiments, the porous oxide comprises $SiO_2$ and the metal oxide comprises aluminum oxide.

The metal oxide or metal nitride can be included in the mesoporous oxide of the disclosure (1) in the form of a conformal layer of the metal oxide or metal nitride on the surface of the porous oxide matrix, (2) in the form of metal oxide or metal nitride nanoparticles dispersed throughout the porous oxide matrix, or (3) as a combination of (1) and (2).

In embodiments, the metal oxide or metal nitride is provided in the form of a conformal layer of the metal oxide or metal nitride on a surface region of the porous oxide matrix. In embodiments, the surface region comprises the entire surface area of the porous oxide matrix. In embodiments, the surface region comprises 20%, 30%, 40%, 50%, 60%, 70%, 80%, or 90% of the entire surface area of the porous oxide matrix. In general, the backbone of the porous oxide matrix of the disclosure has a surface area and the porous oxide matrix and resulting mesoporous oxide of the disclosure have a thickness. The entire surface area of the backbone of the porous oxide matrix can have a conformal layer of a metal oxide or metal nitride thereon. That is, the conformal layer of metal oxide or metal nitride completely penetrates the pores of the porous oxide matrix. As shown in FIGS. 1 and 15, a coating can penetrate only a part of the thickness of the porous oxide matrix such that the entire surface area of the backbone of the porous oxide material is not coated by the metal oxide or metal nitride (FIG. 1A), or the coating can fully penetrate the thickness of the porous oxide matrix, such that the entire surface area of the backbone of the porous oxide material is coated by the metal oxide or metal oxide (FIG. 1B). In embodiments, the conformal layer can completely cover the surface area of the porous oxide matrix. In embodiments, the conformal coating has a uniform thickness gradient through the thickness of the porous oxide matrix.

In embodiments, the metal oxide or metal nitride may only coat a portion of the mesoporous oxide monolith. The portion of the mesoporous oxide monolith can be a surface region of the mesoporous oxide monolith. The surface region comprises 20%, 30%, 40%, 50%, 60%, 70%, 80%, or 90% of the entire surface area of the porous oxide matrix. The infiltration depth is determined by the ALD process parameters (e.g. pulse time, precursor source temperature, exposure time per dose, and number of doses). In this case, the ALD coating would infiltrate from all sides of the mesoporous oxide monolith. In embodiments, a thicker mesoporous oxide monolith is coated, followed by fracture near the middle of the of the monolith to create two monoliths, each with partial infiltration on one side. In embodiments, a pore-blocking material (e.g. a polymer) is used to prevent ALD infiltration into one or more sides of the mesoporous oxide monolith, forcing ALD infiltration on only one side. In embodiments, a partially coated mesoporous oxide monolith can be prepared by combining a fully coated mesoporous oxide monolith and an uncoated mesoporous oxide monolith such that, as a whole, the combined mesoporous oxide monolith has only a partial coating, and the fraction of the monolith coated is determined by the relative amount of fully coated mesoporous oxide monolith to total combined monolith, by volume.

The metal oxide or metal nitride can be provided to the porous oxide under conditions sufficient to promote a chemical reaction at the surface of the porous oxide such that a mixed oxide material forms at an interface between the bulk porous oxide and the bulk metal oxide or metal nitride. As used herein, and unless specified otherwise, "mixed oxide" refers to an oxide material including at least two metal elements and encompasses materials including oxygen and nitrogen, i.e., a mixed metal oxynitride. Conditions sufficient to promote a chemical reaction at the surface of the porous oxide such that a mixed oxide material forms at an interface of the porous oxide and metal oxide or metal nitride can include atomic layer deposition, as described herein.

In embodiments, the mesoporous oxide of the disclosure can include a mixed oxide material disposed between the porous oxide matrix and the metal oxide or metal nitride layer. The mixed oxide material can include at least a portion of the porous oxide and at least a portion of the metal oxide or metal nitride. In embodiments, the mixed oxide is an amorphous ternary material. In embodiments, the mixed oxide can include aluminum and silicon. In embodiments, the mixed oxide can be an amorphous ternary aluminum-silicon oxide phase. Without intending to be bound by theory, it is believed that the increase in infrared absorption from within the silica transparency window (about 3 microns to about 6 microns), is a result of increased water absorption and aluminum hydroxide groups (Al—OH). The increased infrared absorption associated with the amorphous ternary phase is maintained after heat treatment at 700° C. for an extended period (e.g., greater than 48 hours), which is in stark contrast to silica aerogels which represent the current TIM technology. This stable amorphous ternary phase absorption results in a reduction in measured heat losses from an absorber at 700° C. and a high thermal efficiency (about 80% at 700° C. under 60 Suns, based on measured heat loss and solar transmittance).

The conformal coating of metal oxide or metal nitride enhances the suppression of radiative heat losses at elevated temperatures and improves the high-temperature stability relative to conventional (silica-only) aerogels. Without intending to be bound by theory, it is believed that the conformal layer provides a kinetic barrier that stabilizes the structure at elevated temperatures and prevents heat from escaping through mid-infrared bands (about 2 to about 6 micron) that are not absorbed by silica. The conformal coating allows the mesoporous oxide to significantly absorb and suppress re-radiation losses, without significantly increasing the non-radiative thermal conductivity of the mesoporous oxide or significantly decreasing the solar-weighted transmittance of the mesoporous oxide over the AM1.5D standard spectrum. As demonstrated below, the porous oxide having a conformal coating of a metal oxide or metal nitride can remain highly transparent, e.g., greater than 91%, to solar radiation. The demonstrated mesoporous oxides were slightly less transparent compared to conventional silica-only aerogels (91% relative to 96%), but demonstrated significantly increased infrared absorption—specifically within the infrared transparency window of silica-only aerogels. The increased infrared absorption demonstrated by the mesoporous oxides of the disclosure having a metal oxide conformal coating was stable at elevated temperatures, reducing heat losses by about 10% compared to uncoated silica aerogels. Additionally, the mesoporous oxides of the disclosure only experience a 6% increase in heat flux after annealing at 800° C. for two weeks. It is believed that similar benefits can be obtained mesoporous oxides of the disclosure having a metal nitride conformal coating because metal nitrides share properties with the metal oxides that allow the metal oxides to provide benefits to the porous oxide, in particular, high transparency in the AM1.5 standard spectrum, high absorption in the mid-infrared bands (about 2 to about 6 micron), and the complete conformal coating would be expected to provide the same stability at elevated temperatures.

In embodiments, the metal oxide or metal nitride is provided in the form of nanoparticles dispersed within the porous oxide matrix. The nanoparticles generally have a diameter of about 100 nanometers or less and the minimum size of the nanoparticles is not particularly limiting. In embodiments, the nanoparticles have a diameter of about 100 nanometers or less. In embodiments, the nanoparticles have a diameter in a range of about 1 nm to about 100 nm, about 5 nm to about 90 nm, about 5 nm to about 15 nm, about 5 nm to about 20 nm, about 5 nm to about 30 nm, about 5 to about 50 nm, about 10 nm to about 85 nm, about 10 nm to about 30 nm, about 10 nm to about 50 nm, about 20 nm to about 80 nm, about 30 nm to about 80 nm, about 40 nm to about 80 nm, or about 50 nm to about 80 nm. The foregoing size ranges can represent an average nanoparticle size (e.g., weight-, volume-, or number-based average) and/or upper and lower boundaries of a nanoparticle size distribution (e.g., 10%/90%, 5%/95%, 1%/99% cumulative sizes for a weight-, volume-, or number-based size distribution). In general, as the size of the nanoparticles increases above about 100 nm, the amount of light scattered by the nanoparticles increases, ultimately resulting in a lower, unsuitable, transmittance of incident solar light (AM1.5D spectrum) through the mesoporous oxide.

In embodiments, the volume fraction of the nanoparticles in the mesoporous oxide is in a range of about 0.002% to about 5%, based on the total volume of the mesoporous oxide, for example, about 0.002% to about 5%, about 0.002% to about 3%, about 0.002% to about 1%, or about 0.002% to about 0.5%. The total volume of the mesoporous oxide includes the pore void volume. When the metal oxide or metal nitride is provided in the form of nanoparticles only, as the volume fraction of the nanoparticles in the mesoporous oxide decreases below about 0.002%, the mesoporous oxide does not demonstrate the beneficial increase of absorption of infrared light between about 2 and about 6 micron. As the volume fraction of nanoparticles in the mesoporous oxide increases above about 5%, the amount of light scattered by the nanoparticles increases, ultimately resulting in a lower, unsuitable transmittance of incident solar light (AM1.5D spectrum) through the mesoporous oxide.

The nanoparticles can include any metal oxide or metal nitride disclosed herein. In embodiments, the nanoparticles comprise an electrically transparent conductive oxide material, an electrically transparent semiconductive oxide material, or a combination thereof. In embodiments, the nanoparticles comprise indium tin oxide (ITO), zinc oxide (ZnO), titanium dioxide ($TiO_2$), antimony oxide ($Sb_2O_3$), titanium oxide ($Ti_2O_3$), titanium nitride (TiN), tin dioxide ($SnO_2$). In embodiments, the nanoparticles comprise indium tin oxide (ITO).

In embodiments, the nanoparticles have a localized surface plasmon absorption resonance at a wavelength in a range of about 2 to about 8 microns, for example, in a range of about 2 microns to about 8 microns, about 3 microns to about 6 microns, or about 3 to about 5 microns.

In embodiments wherein the porous oxide has metal oxide or metal nitride nanoparticles dispersed therein, the nanoparticles enhance the greenhouse effect in the porous oxide. The greenhouse effect arises when thermal radiation is forced to undergo many absorption and re-emission events before escaping, while sunlight transmits largely unimpeded. The greenhouse effect is generally weak within solid-state materials because radiation can be easily overpowered by other modes of heat transfer. By including the metal oxide or metal oxide nanoparticles in the porous oxide matrix, the mean free path of thermal photons is selectively shortened while maintaining high solar transmittance. The addition of a small amount (e.g., less than about 0.1% by volume) of transparent conducting or semiconducting oxide or nitride nanoparticles can result in a nearly three-fold greater thermal absorption coefficient than state-of-the-art silica aerogels, resulting in a nearly two-fold reduction in heat losses at 700° C., leading to an experimentally demonstrated effective thermal emittance of about 0.17 at 700° C. It was found that the enhanced greenhouse effect is strong enough to overcome other parasitic modes of heat loss, such as conduction, to significantly improve spectral selectivity at high temperatures.

The mesoporous oxides of the disclosure generally can have a porosity of at least about 25%, as determined according to the Porosity Test disclosed herein. The porosity refers to the fraction of air (or other void or gas volume) relative to the total volume of the mesoporous oxide. In embodiments, the mesoporous oxides of the disclosure have a porosity of at least about 25%, at least about 30% at least about 50%, at least about 65%, at least about 75%, at least about 80%, at least about 85%, at least about 90%, or at least about 95%. In embodiments, the mesoporous oxides of the disclosure additionally have a porosity of up to about 90%, up to about 95%, up to about 97%, up to about 98%, or up to about 99%. The mesoporous oxides of the disclosure generally have a density of about 550 kg/m³ or less, for example in a range of about 1 kg/m³ to about 550 kg/m³, about 10 kg/m³ to about 500 kg/m³, about 100 kg/m³ to about 400 kg/m³, about 125 kg/m³ to about 300 kg/m³, about 150 kg/m³ to about 250 kg/m³, about 175 kg/m³ to about 225 kg/m³, about 150 kg/m³ to about 175 kg/m³, or about 200 kg/m³ to about 400 kg/m².

The mesoporous oxide TIMs of the disclosure generally can be opaque to thermal radiation. In general, the mesoporous oxide TIMs of the disclosure can have a Rosseland weighted absorption coefficient of about at least 1 cm⁻¹, at least about 3 cm⁻¹, or at least about 7 cm⁻¹ and up to about 1000 cm⁻¹, at a temperature of at least about 400° C. The resistance to thermal radiative transfer scales inversely with the thermal opacity of the TIM. The Rosseland weighted extinction coefficient effectively weights regions of lower extinction coefficients where more radiative transfer will occur.

The mesoporous oxide TIMs of the disclosure generally can have a solar-weighted transmittance of at least 65% over the AM1.5D standard spectrum, for example, in a range of about 65% to about 100%, about 70% to about 100%, about 75% to about 100%, about 80% to about 100%, about 65% to about 99%, about 75% to about 99%, about 80% to about 99%, or about 65%, about 70%, about 75%, about 80%, about 85%, about 90%, about 95%, about 98%, about 99%, or about 100%. It will be understood that the transmittance can be increased by using thinner mesoporous oxides and will be ultimately limited by the effective refractive index of the mesoporous oxide to about 99.5% and below.

The mesoporous oxide TIMs of the disclosure are stable at high temperatures, for example, in a range of about 400° C. to about 1000° C., about 500° C. to about 900° C., about 600° C. to about 800° C., or about 700° C., for example, about 400° C., about 500° C., about 600° C., about 700° C., about 800° C., about 900° C., or about 1000° C. In embodiments, the mesoporous oxide is stable at a temperature of about 400° C. In embodiments, the mesoporous oxide is stable at a temperature of about 600° C. In embodiments, the mesoporous oxide is stable at a temperature of about 700° C.

The mesoporous oxide TIMs of the disclosure generally can have low heat loss at high temperatures, for example, about 700° C. In embodiments, the effective thermal emittance values of about 0.3 to about 0.1 over a range of temperatures of about 550° C. to 700° C., as determined by the Heat Flux test.

The disclosure further provides a method for preparing a mesoporous oxide TIM, the method including depositing a metal oxide or metal nitride onto a porous oxide material of the disclosure. The depositing of the metal oxide or metal nitride onto the porous oxide material can include gas phase atomic-layer deposition (ALD). Other deposition methods for providing a layer of metal oxide or metal nitride onto the porous oxide material can include other chemical vapor deposition methods, solution based coating methods such as liquid phase ALD, or successive ionic layer adsorption and reaction (SILAR).

ALD is a deposition technique based on the sequential introduction of precursor materials which react with the surface of a material one at a time in a sequential, self-limiting, manner. Typically, a first precursor is introduced to the material in a first ALD half-cycle, followed by purging of the first precursor and introduction of a second precursor to the material in a second ALD half-cycle. The combination of the first and second half cycle provide a first layer of deposited material. The ALD of the disclosure can be a modified version of a procedure known as quasi-static mode (QSM). In QSM ALD, individual precursors are sequentially pulsed into the reaction chamber without active pumping or purging, during an "exposure time." After the exposure time, the ALD reaction chamber is opened and the ALD reaction chamber can be purged with an inert gas such as Ultrahigh Purity (UHP) argon to remove excess reagents and any air that may have leaked into the ALD chamber.

In order to conformally coat silica aerogels an ALD procedure known as QSM (sometimes referred to as "Exposure Mode™") can be implemented, using, for example, a reactor according to the schematic illustrated in FIG. 14. During the "Dose" step the precursor is dosed into the chamber with the outlet valve closed. During the "Exposure" step the precursor diffuses into the aerogel to a desired depth, without pumping or purging. During the "Purge" step, the reactor is flushed with argon, thereby removing any remaining reactant and product species. In the multi-dose QSM ALD process of the disclosure, the same precursor (e.g., trimethylaluminum, TMA) is dosed, exposed, and purged multiple times before dosing the counter reactant. This approach allows for replenishment of the depleted precursor partial pressure during sequential doses, which decreases the time required for complete infiltration of the aerogel compared to using a single exposure step. Additionally, multi-dose QSM allows more precursor to be dosed into the chamber, to account for cases in which a single dose does not supply the necessary dose to react with every site on the substrate. By the end of the QSM process, the aerogel has been coated to a desired infiltration depth.

In embodiments, the ALD comprises a first precursor half-cycle and a second precursor half cycle, wherein the first precursor half-cycle comprises contacting the porous matrix with a first precursor material in an ALD chamber and the second precursor half-cycle comprises contacting the porous matrix with a second precursor material in the ALD chamber. The first precursor half-cycle is performed once and then repeated about 1 to about 5000 times, about 1 to about 2500 times, about 1 to about 1000 times, or about 1 to 500 times sequentially and the second precursor half-cycle is repeated about 1 to about 500 times sequentially. As used herein, and unless specified otherwise, the half-cycle is "repeated about 1 to 500 times sequentially" when the first precursor half-cycle (i.e., pulsing, exposure, and purging) is repeated about 1 to about 500 times, without any interruption to introduce the second precursor to the ALD chamber. Thus, in embodiments, the first precursor half-cycle is performed two or more times sequentially. Similarly, the second precursor half-cycle is performed once and then repeated about 1 to about 5000 times, about 1 to about 2500 times, about 1 to about 1000 times, or about 1 to about 500 times sequentially, without any interruption to introduce the first precursor. Thus, in embodiments, the second precursor half-cycle is performed two or more times sequentially. The sequential first precursor-half cycles and sequential second precursor half-cycles in combination with the purge cycles make up one ALD cycle. In embodiments, the method consists of one ALD cycle. In embodiments, the method consists of two ALD cycles. In general, it will be understood that as the size of the substrate increases, the number of repetitions for each half-cycle (and precycle(s) and purging cycles(s) as disclosed herein) may need to correspondingly increase in order to conformally coat the substrate. Thus, the upper limit on the number of half-cycles (and precycle(s) and purging cycle(s)) can be considered a practical limit that is required to conformally coat the substrate without performing excess half-cycles such that excess precursor materials are used/wasted with diminishing returns.

Prior to the first precursor half-cycle, the ALD chamber is purged with an inert gas and immediately before introduction of the first precursor, the flow rate of the inert gas is reduced to lower the pressure of the chamber. This creates a greater partial pressure difference between the gases in the precursor cylinders and the ALD chamber, increasing the amount of precursor dosed into the chamber. The temperature of the precursors in the precursor cylinders can be higher than ambient temperature, e.g., about 30° C., about 35° C., about 37° C., about 40° C., about 60° C., about 80° C., about 100° C., or about 120° C. to increase the partial pressure of the precursors in the cylinders. As the temperature of the precursors in the precursor cylinders increase, the partial pressure of the precursors in the cylinders increases and the greater the difference in partial pressure between the cylinders and the ALD chamber can be, resulting in an increased amount of precursor being dosed into the chamber. The ALD chamber can be purged between the sequential first precursor half-cycles to remove unreacted precursor and product species, and reduce the pressure in the chamber to facilitate the introduction of the first precursor in the following half-cycle. FIG. 2A is an example pressure profile for a first half-cycle and FIG. 2B is an example pressure profile wherein two trimethylaluminum (TMA) half cycles are performed before two water half-cycles to provide an aluminum layer on a porous oxide matrix (the pressure and time values are for demonstration only). In each half-cycle, the precursor is pulsed into the ALD chamber, followed by an exposure time to allow the precursor to react with the surface of the porous oxide material.

In general, the number of sequential first precursor half-cycles, number of sequential second precursor half-cycles, and exposure time for the first and second precursor half cycles can be selected to allow the first and second precursors to fully penetrate the matrix of the porous oxide. Thus, in some embodiments the number of sequential first precursor half-cycles and sequential second precursor half-cycles can be low (e.g., 1-10 times) with long exposure times. In alternative embodiments, the number of sequential first precursor half-cycles and sequential second precursor half-cycles can be high (e.g., hundreds) with relatively short exposure times. As shown in FIG. 15, even when a sufficiently large number of precursor doses was used to coat the entire aerogel monolith (AM), short exposure times per dose hindered infiltration into the AM, primarily due to diffusion limitations. Depositions using a low number of precursor doses with long exposure times per dose have similarly low infiltration depths into the AM. The entire AM can only be fully and conformally coated by using a sufficiently large number of precursor doses (e.g., 12) and long exposure times (e.g., 400 s).

In embodiments, the first precursor half-cycle can be repeated about 1 to about 5000 times, about 1 to about 2500 times, about 1 to about 1000 times, about 1 to about 500 times, for example, 1 to 500 times, 1 to 450 times, 2 to 400 times, 2 to 350 times, 3 to 300 times, 3 to 250 times, 4 to 200 times, 4 to 150 times, 5 to 100 times, 5 to 25 times, 10 to 30 times, 20 to 100 times, 30 to 90 times, 40 to 80 times, 40 to 75 times, 45 to 70 times or 45 to 60 times before introduction of the second precursor half-cycle. In embodiments, the first precursor half-cycle can be repeated 10 to 60 time, 10 to 15 times, 10 to 30 times, 30 to 60 times, or 45 to 60 times before introduction of the second precursor half-cycle. In embodiments, the first precursor half-cycle can be repeated 60 times prior to the introduction of the second precursor. In embodiments, the second precursor half-cycle can be repeated about 1 to about 5000 times, about 1 to about 2500 times, about 1 to about 1000 times, about 1 to about 500 times, for example, 1 to 500 times, 1 to 450 times, 2 to 400 times, 2 to 350 times, 3 to 300 times, 3 to 250 times, 4 to 200 times, 4 to 150 times, 5 to 100 times, 2 to 25 times, 10 to 30 times, 20 to 100 times, 30 to 90 times, 40 to 80 times, 40 to 75 times, 45 to 70 times or 45 to 60 times to complete the deposition of the first layer of metal oxide or metal nitride. In embodiments, the number of times the first precursor half-cycle is repeated can be the same as the number of times the second precursor half-cycle is repeated. In embodiments, the number of times the first precursor half-cycle is repeated can be different from the number of times the second precursor half-cycle is repeated. The entire first precursor half-cycle deposition and second precursor half-cycle deposition can be repeated to provide additional layers of metal oxide or metal nitride.

During each precursor half-cycle, the precursor is pulsed into the ALD chamber for a designated time period, followed by an exposure time. The duration of the pulsing depends, in part, on the partial pressure of the precursor material in the precursor cylinder and the difference in partial pressure between the precursor cylinder and the ALD chamber, as well as the vaporization kinetics of the precursor. The duration of the pulsing is selected to provide the maximum amount of precursor to the ALD chamber. The maximum amount of precursor has been delivered when the pressure in the chamber no longer increases with additional pulsing. The exposure time is selected to allow sufficient time for the precursors to diffuse into the entire porous oxide structure. The first precursor half-cycle and the second precursor half-cycle can have an exposure time of about 10 s to about 600 s, for example about 10 s to about 600 s, about 15 s to about 600 s, about 30 s to about 600 s, about 60 s to about 550 s, about 120 s to about 550 s, about, 150 s to about 500 s, about 200 s to about 500 s, about 250 s to about 450 s, about 300 s to about 450 s, or about 350 s to about 450 s, or about 400 s. Without intending to be bound by theory, it is believed that if the exposure time is greater than about 600 s the time to execute the method of the disclosure increases, with no apparent benefit as the precursors have typically had sufficient time to penetrate the porous oxide. In embodiments, the first precursor half-cycle has an exposure time of about 10 s to about 600 s. In embodiments, the first precursor half-cycle has an exposure time of about 150 s to about 500 s. In embodiments, the first precursor half-cycle has an exposure time of about 350 s to about 450 s. In embodiments, the second precursor half-cycle has an exposure time of about 10 s to about 600 s. In embodiments, the second precursor half-cycle has an exposure time of about 150 s to about 500 s. In embodiments, the second precursor half-cycle has an exposure time of about 350 s to about 450 s. In embodiments, the first precursor half-cycle exposure time is the same as the second precursor half-cycle exposure time. In embodiments, the first precursor half-cycle exposure time is different from the second precursor half-cycle exposure time.

In general, the temperature of the deposition of the metal oxide or metal nitride (i.e., the temperature of the first and second half-cycles) can be any temperature that facilitates the penetration of the first and second precursor into the porous oxide matrix without thermally decomposing the deposited precursors of the porous metal oxide. In general, the depositing is at a temperature in a range of about 50° C. to about 300° C., for example, about 50° C. to about 300° C., about 100° C. to about 250° C., or about 125° C. to about 200° C. Without intending to be bound by theory, it is believed that as the temperature decreases below 50° C., the rate of deposition of the precursor becomes diffusion limited and the risk of condensation of the precursor and blockage of the pores of the porous oxide matrix increases. Further, without intending to be bound by theory, it is believed that as the temperature increases above 300° C., the risk of thermal decomposition and loss of the ALD character of the growth increases. In embodiments, the depositing is at a temperature in a range of about 50° C. to about 300° C. In embodiments, the depositing is at a temperature in a range of about 125° C. to about 200° C.

Prior to initiating the first half-cycle, the porous oxide matrix can be placed in the ALD chamber and the chamber heated to remove excess water and other adsorbed species.

The chamber can be heated to a temperature in a range of about 100° C. to about 300° C., or about 125° C. to about 175° C., under vacuum for at least about one hour. Without intending to be bound by theory, it is believed that no significant difference in removal of excess water and other adsorbed species occurs after 1 hour. Optionally, after removal of excess water and other adsorbed species, the method can further include precycles of the second precursor prior to depositing the metal oxide or metal nitride, in order to prepare the surface of the porous oxide matrix. Deionized water precycles can ensure the porous oxide matrix surface was hydroxyl terminated to promote ALD nucleation. In embodiments, that include a precycle, the method can include about 1 to about 5000 precycles, about 1 to about 2500 precycles, about 1 to about 1000 precycles, or about 1 to 500 precycles.

The methods of the disclosure can further include a purging cycle after the about 1 to about 500 first precursor half cycles and prior to the second 1 to 500 precursor half-cycles. In embodiments, the purging cycle can be twice the exposure time of the first precursor half-cycle. The methods of the disclosure can further include a purging cycle between each sequential first precursor half-cycle and between each sequential second precursor-half cycle.

In embodiments, the methods of the disclosure provide a mesoporous oxide of the disclosure. In embodiments, the depositing of the metal oxide or metal nitride provides a conformal coating of metal oxide or metal nitride over the surface area of the porous oxide.

The methods of the disclosure can include any porous oxide of the disclosure. In embodiments, the porous oxide has metal oxide or metal nitride nanoparticles dispersed throughout the porous oxide matrix. In embodiments, the porous oxide is free of metal oxide or metal nitride nanoparticles in the porous oxide matrix.

In embodiments, the first precursor can include trimethylaluminum (TMA), silicon tetrachloride, tetraethyl orthosilicate, tris(tert-butoxy)silanol, tris(tert-pentoxy)silanol, tetrakis(diethylamido)titanium(IV), tetrakis(dimethylamido)titanium(IV), titanium tetrachloride, titanium(IV) isopropoxide, diethylzinc, bis(methyl-$\eta^5$-cyclopentadienyl) methoxymethylzirconium, tetrakis(dimethylamido)zirconium(IV), tetrakis(ethylemethylamido)zirconium(IV), zirconium(IV) tert-butoxide, hafnium(IV) tert-butoxide, tetrakis(dimethylamido)hafnium(IV), tetrakis(ethylmethylamido)hafnium(IV), or a combination thereof. In embodiments, the first precursor includes trimethylaluminum (TMA).

In embodiments, the second precursor can include deionized water, hydrazine, ammonia, ozone, oxygen, nitrogen, hydrogen, plasmas (including but not limited to oxygen plasma) or a combination thereof. In embodiments, the second precursor can include deionized water, hydrazine, ammonia, or a combination thereof. In embodiments, the second precursor includes deionized water. In embodiments, the second precursor includes ammonia.

In embodiments, the first precursor includes trimethylaluminum (TMA) and the second precursor includes water. In embodiments, depositing comprises atomic-layer deposition comprising repeating a first precursor half cycle 45 to 60 times, the first precursor half-cycles each having an exposure time of 400 s and the first precursor comprising trimethylaluminum; and repeating a second precursor half-cycle 45 to 60 times, the second precursor half-cycles each having an exposure time of 400 s and the second precursor comprising deionized water.

In embodiments, the first precursor includes trimethylaluminum (TMA) and the second precursor includes water. In embodiments, depositing comprises atomic-layer deposition comprising repeating a first precursor half cycle 10 to 30 times, the first precursor half-cycles each having an exposure time of 400 s and the first precursor comprising trimethylaluminum; and repeating a second precursor half-cycle 10 to 30 times, the second precursor half-cycles each having an exposure time of 400 s and the second precursor comprising deionized water.

In embodiments, the methods of the disclosure can provide a porous oxide matrix having a conformal coating having a uniform thickness gradient through the thickness of the porous oxide. In general, deposition of the precursors occurs more readily near the outer surfaces of the porous oxide matrix relative to the inner, core, portions of the matrix. Accordingly, a gradient in the thickness of the coating may form if the exposure time and/or number of half-cycle repetitions are too short.

The ALD methods of the disclosure provide methods for functionalizing porous oxide matrices with a conformal coating, and provides unprecedented control over the thickness of the metal oxide or metal nitride layer, doping level, and composition. In turn, the methods enable precise tuning of the spectral selectivity and scattering pore size. For example, for a conformal coating of an aluminum-zinc oxide the absorption resonance can be tuned depending on the ratio of alumina to zinc oxide layers.

The penetration depth of the metal oxide or metal nitride can be determined using the ALD Penetration Depth Test described herein.

Porous oxide matrices with nanoparticles dispersed therein can be prepared using known sol-gel techniques. In general, a solution including the oxide material that will make up the porous oxide matrix and a solution that includes a gelling catalyst and the nanoparticles to be dispersed can be admixed in a container and allowed to gel.

The mesoporous oxides of the disclosure can generally be used in solar devices for use at high temperatures. The mesoporous oxides of the disclosure allow sunlight to transmit to the absorber but block heat from escaping in the form of radiation, convection and conduction. The greenhouse effect is leveraged to suppress energy losses from a high-temperature solar absorber. The disclosure further provides solar receiver including a solar absorber layer, a window layer, and a mesoporous oxide of the disclosure provided as a layer disposed between the solar absorber layer and the window layer. The mesoporous oxide layer can include a porous oxide matrix and a metal oxide or metal nitride, wherein the metal oxide or metal nitride is (1) in the form of a conformal layer of the metal oxide or metal nitride on the surface of the porous oxide matrix and the conformal layer completely covers the porous oxide through a thickness of the matrix, (2) in the form of metal oxide or metal nitride nanoparticles distributed throughout the porous oxide matrix, or (3) a combination of (1) and (2), wherein the porous oxide is not the same as the metal oxide.

Solar absorber layers and window layers for solar absorbers are well known in the art. Typically, the window layer comprises a borosilicate glass with an anti-reflective coating. Suitable solar absorber layers and window layers are commercially available in solar receivers such as Schott PTR© receivers, Royal Tech SCP UVR receivers, and Solel UVAC 3 receivers. The mesoporous oxide layer can be, but need not be, in direct contact with the solar absorber and/or the window layer. In embodiments, the mesoporous oxide layer is in direct contact with at least one of the solar absorber and the window. In embodiments, the mesoporous oxide layer is in direct contact with the solar absorber. In embodiments, the mesoporous oxide layer is not in direct contact with either the solar absorber or the window. In embodiments, the mesoporous oxide layer is supported by the solar receiver enclosure.

In embodiments, the mesoporous oxide layer has a thickness in a range of about 0.5 mm to about 15 cm. Without intending to be bound by theory, it is believed that as the thickness of the mesoporous oxide layer increases, the solar transparency will decrease resulting in poor performance and as the thickness of the mesoporous oxide decreases below about 0.5 mm, the heat loss suppression provided by the mesoporous oxide layer will be limited and the mechanical properties of the mesoporous oxide can become limiting (e.g., demonstrating an increased susceptibility to fracture/catastrophic failure). The mesoporous oxide layer does not need to be provided as a continuous layer having the desired thickness but can be provided as a stack of adjacent, thinner mesoporous oxide layers. For example, while a mesoporous oxide layer could be provided as a 12 mm thick layer, a 12 mm thick mesoporous oxide layer can also be provided by four 3 mm thick mesoporous oxide layers stacked together.

The mesoporous oxide layer can include any of the mesoporous oxides of the disclosure comprising any of the porous oxide matrices of the disclosure and any of the metal oxides or metal nitrides of the disclosure.

The solar receivers of the disclosure generally can be opaque to thermal radiation. In general, the solar receivers of the disclosure can have a Rosseland weight absorption coefficient of about at least 1 $cm^{-1}$, at least about 3 $cm^{-1}$, or at least about 7 $cm^{-1}$ and up to about 1000 $cm^{-1}$, at a temperature of at least about 400° C.

The solar receivers of the disclosure generally can have a solar-weighted transmittance of at least 65% over the AM1.5D standard spectrum, for example, in a range of about 65% to about 100%, about 70% to about 100%, about 75% to about 100%, about 80% to about 100%, about 65% to about 99%, about 75% to about 99%, about 80% to about 99%, or about 65%, about 70%, about 75%, about 80%, about 85%, about 90%, about 95%, about 98%, about 99%, or about 100%.

The solar receivers of the disclosure are stable at high temperatures, for example, in a range of about 400° C. to about 1000° C., about 500° C. to about 900° C., about 600° C. to about 800° C., or about 700° C., for example, about 400° C., about 500° C., about 600° C., about 700° C., about 800° C., about 900° C., or about 1000° C. In embodiments, the solar receiver is stable at a temperature of about 400° C. In embodiments, the solar receiver is stable at a temperature of about 600° C. In embodiments, the solar absorber is stable at a temperature of about 700° C.

The solar receiver of the disclosure generally can have low heat loss at high temperatures, for example, about 700° C. In embodiments, the effective thermal emittance values of about 0.3 to about 0.1 over a range of temperatures of about 550° C. to about 700° C., as determined by the Heat Flux test.

The solar receivers of the disclosure provide advantages over the current state of the art. In particular, currently uncoated silica aerogels are used as TIMs. Although silica aerogels have been viewed as a potential alternative to vacuum insulation, they suffer from large radiative losses at high temperatures due to transmittance in the mid-IR, particularly below 5 micron. At 700° C., roughly 60% of the blackbody emitted power lies below 5 micron. Previous attempts to functionalize these aerogels to enhance absorption in this band have higher decreased the solar transparency, increased the non-radiative thermal conductivity, or are not stable at elevated temperatures. The uncoated silica aerogels themselves are not stable above 600° C. In contrast, the solar absorbers of the disclosure are stable in air at temperatures greater than 600° C.

Another current technology is the use of surface coatings, which have increasing re-radiation losses at increasing temperatures, as shown in FIG. 3. In contrast, due to the infrared vibrational modes of the mesoporous oxides of the disclosure, the mesoporous oxides display low thermal losses (FIG. 4)

Future concentrated solar power plants will require elevated temperatures (~700° C.) to be compatible with high-efficiency cycles, e.g., super critical $CO_2$.

ALD Penetration Depth Test

The penetration depth of the ALD coating can be evaluated using scanning electron microscopy (SEM) energy-dispersive x-ray spectroscopy (EDS) by measuring the relative amounts of metals and oxygen in the mesoporous oxide. A TESCAN MIRA3 FEG SEM, or equivalent, can be used to take these measurements. Samples of mesoporous oxide cross sections for SEM-EDS are cut far from the edge of the oxide to avoid edge effects. Samples are mounted using carbon tape at the top and bottom axial surfaces of the samples. EDS line scans are then performed along the axial direction.

The penetration depth is determined by the location where the signal for the metal of the metal oxide or nitride drops below 80% of its rolling average, starting at the surface of the mesoporous oxide. For the example of a silica matrix coated with an aluminum oxide, the penetration depth is determined by the location where the Al signal drops below 80% of its rolling average.

XPS Measurements

XPS data was collected using a Kratos Axis Ultra, or equivalent, with an 8 channel detector and a monochromated Al source. Measurements were taken without an argon plasma etch step due to the porous nature of the mesoporous oxides and aluminum-silicate references. Reported data used 20 eV pass energy to precisely measure the binding energy profile of each relevant element. Samples were prepared by crushing the mesoporous oxides using a mortar and pestle, followed by pressing the powder on conductive Cu tape on an XPS sample bar. Samples were allowed to offgas in the XPS for several hours to remove residual water and allow the chamber base pressure to get low enough for measurements to be taken.

Optical Property Measurements.

The solar direct-hemispherical transmittance of the samples were measured with a UV-Vis-NIR spectrophotometer (Shimazdu UV-3600 Plus or equivalent) and an integrating sphere attachment (Shimazdu, ISR-603 or equivalent). The infrared measurements were obtained with a Fourier transform infrared (FTIR) spectrophotometer (Agilent Cary 670 or equivalent) and a Pike Technologies mid-IR integrated sphere (or equivalent).

Heat Flux Test and Thermal Conductivity Measurements.

The samples were placed on a hot stage (Instec or equivalent) with a high-precision temperature controller (Instec MK2000 or equivalent) in vacuum. The heat flux was measured with a heat flux sensor (greenTEG gSKIN XP 26 9C or equivalent) covered with a blackbody absorber (Acktar Metal Velvet or equivalent). The heat flux sensor was adhered to a copper mesa block which was actively maintained near room temperature using compressed air. Importantly, the heat flux should be 1-dimensional. That is the view factor from the sensor to the top of the material should be approximately one. Otherwise, it may underestimate the heat flux. In other words, that means that the area of the sensor should be smaller than the material of interest. An experimental set up is shown in FIG. 10A.

The thermal conductivity of the samples were measured using the transient plane source (TPS) method (Hot Disk TPS 2500 S or equivalent) and Kapton sensors (Hot Disk Kapton 5465 or equivalent) with a heating power of 5 mW for a duration of 40 seconds.

Porosity Test

The porosity is by definition the percentage of air within a porous material. The porosity can be measured by dividing the mass of the sample by its total volume, and to then divide that by the density of the sample backbone to get the volume consumed by the solid network. The porosity is then 1−solid volume.

In mathematical terms:

$$\% \text{ porosity} = \left( 1 - \frac{\frac{\text{mass of sample}}{\text{total volume}}}{\text{density of sample backbone}} \right) * 100\%$$

Solar Weighted Transmittance

The transmission of a material is multiplied by the AM1.5D standard incident solar spectrum and integrated over all wavelengths (or frequencies). That value is divided by the integration of the unaltered AM1.5D spectrum. Mathematically:

$$\text{Solar weighted transmittance} = \frac{\int T_{sample} P_{solar} d\lambda}{\int P_{solar} d\lambda}$$

where Tsample is the transmittance of the sample, and P is the spectral intensity of the AM1.5D spectrum.

Infrared Extinction

The infrared weighted extinction coefficient is calculated via the Rosseland weighted extinction coefficient using the temperature of the absorber.

$$\frac{1}{\kappa_R} = \frac{\pi}{4\sigma T_{abs}^3} \int \frac{1}{\kappa_\eta} \frac{dI_{b\eta}}{dT} d\eta$$

where $\kappa_R$ is the Rosseland weighted extinction coefficient, $T_{abs}$ is the temperature of the absorber (in Kelvin), $I_{b\eta}$ is the spectral blackbody intensity, $\kappa_\eta$ is the spectral extinction coefficient of the material, and $\eta$ is wavenumber.

Optical and Materials Characterization of Mesoporous Oxides

Using a modified ALD exposure mode, a conformal and uniform ultrathin alumina coating (~1 Å, 1 ALD cycle) was deposited on silica discs, with diameters of ~ 25 mm and thicknesses of ~3 mm. The uncoated silica had a water-free density of ~160 kg/m³ while the coated mesoporous oxides had a density of ~200 kg/m³. The uncoated and coated oxides were found to be amorphous by X-ray diffractometry (XRD).

The ALD parameters are as follows: at the beginning of the exposure time, the precursors were pulsed in for a designated time period (2.5 s for TMA and 1.5 s for DI water), followed by an exposure time of 400 s. The partial pressure of the precursors in the chamber at the start of the exposure was estimated to be close to the difference between the vapor pressure of the precursors at 37° C. and the base pressure of the chamber, due to the long pulse time. Pulse times beyond 2.5 s for TMA and 1.5 s for DI water did not result in further chamber pressure increases. Given the base pressure of less than 1 Torr using an Ar flow rate of 10 sccm, the partial pressure of TMA at the start of the exposure time was estimated as ~20 Torr, while the water partial pressure was ~40 Torr. This was followed by a 70 sccm Ar purge step of about 800 s. The number of precursor half-cycles before pulsing the counter reactant varied, but was generally 45 or 60 for both TMA and DI water in the mesoporous oxides reported herein.

The solar and infrared (IR) transmission through the mesoporous oxides was measured using ultraviolet-visible-near infrared spectrophotometry (UV-Vis-NIR) and Fourier-transform infrared spectroscopy (FTIR). The solar weighted transmittance (T) of the uncoated silica was found to be ~96% (FIG. 6A). After applying 1 cycle of ALD alumina, the T of the coated silica was found to decrease by only ~1-3%. This was enabled by the porous oxide backbone, silica, and the conformal coating, alumina, both being highly transparent in visible and near-IR wavelengths. Hemispherical reflectance data suggested the decrease in T is a result of increased scattering at shorter wavelengths (<1 μm) and increased absorption in the near-IR.

Although the solar transmission was mildly affected by the ALD alumina coating, the mid-IR transmission at room temperature (about 20-25° C.) was significantly decreased. Notably, the silica transparency window (3-5 μm) was eliminated in the coated samples, within the sensitivity of the FTIR instrument. To elucidate the magnitude of the absorption, the extinction coefficients of the uncoated and coated oxides were measured using KBr FTIR spectroscopy (FIG. 6B). The extinction coefficient within the transparency window increased more than four-fold after depositing the ALD coating, demonstrating enhanced IR absorption. Because alumina and silica do not absorb in this transparency window, other possible compounds in the samples were investigated. Variable temperature DRIFTS measurements indicate surface adsorbed water and aluminum hydroxide groups (Al—OH) are significantly more stable in the ALD-coated samples.

In addition to their high solar transmittance, the ALD-coated aerogel of the disclosure exhibits higher infrared absorption (FIG. 6E). The alumina coating introduces new vibrational modes at longer wavelengths due to the stretching (~11.5 μm) and vibrational (~16 μm) modes typical of alumina-silica chemistries. Furthermore, noticeably higher absorption at room temperature was observed within the aerogel's infrared transparency window of 3-5 μm. The absorption peak within this window suggests that water is present to a greater extent in the ALD-coated aerogel which differs from uncoated aerogels. Annealing of pure silica aerogels at high temperatures drives off adsorbed water and facilitates condensation reactions involving silanol groups. On the other hand, DFT studies show alumina surfaces demonstrate thermally stable water adsorption because the surface energies of terminated alumina sites are much higher than unterminated alumina. Once alumina surfaces becomes terminated after exposure to high temperatures, re-hydroxylation occurs at room temperature and restores its hydrophilic nature—a phenomenon observed with the aerogels of the disclosure.

X-ray photoelectron spectroscopy (XPS) was used to determine the change in the Si and O binding environment after ALD coating. In each sample, binding energy levels were calibrated to adventitious surface carbon. The coated oxide samples in XPS experiments were coated with ~1-2 Å of ALD alumina. The results show that the coating shifted the Si 2p peak to lower binding energies (FIG. 6C), consistent with literature values for expected shifts with increasing aluminum content in aluminum-silicate compounds. This was experimentally confirmed using comparisons to mullite and aluminum silicate references, which showed lower Si 2p binding energies compared to uncoated aerogels. Coated oxide samples were analyzed again after high temperature annealing, showing slight upward shifts in binding energy. However, the trend of lower binding energies compared to uncoated silica was maintained. Similar binding energy shifts were observed in the O 1s core scans of ALD-coated silicas (FIG. 8D), consistent with literature reports of increasing aluminum content in aluminum-silicates. The O 1s peak shifts followed similar trends to experimentally measured aluminum-silicate references.

Improvements in TIM Performance

To experimentally demonstrate the improvement in TIM performance of the mesoporous oxides of the disclosure relative to uncoated silica, the heat flux through the coated and uncoated silica was measured at various temperatures in vacuum (FIG. 13B). The results showed the increased IR absorption in the coated sample suppressed heat losses by over two-fold compared to the uncoated silica aerogel. As previously noted, no contaminants were present as a result of the ALD process. Accordingly, the increased IR absorption can be attributed to the ALD coating. The decrease in heat flux was exclusively attributed to the increased IR absorption because conduction is a minimal factor in vacuum and at high temperatures.

Figures 7A, 7B, 8A, 8B:
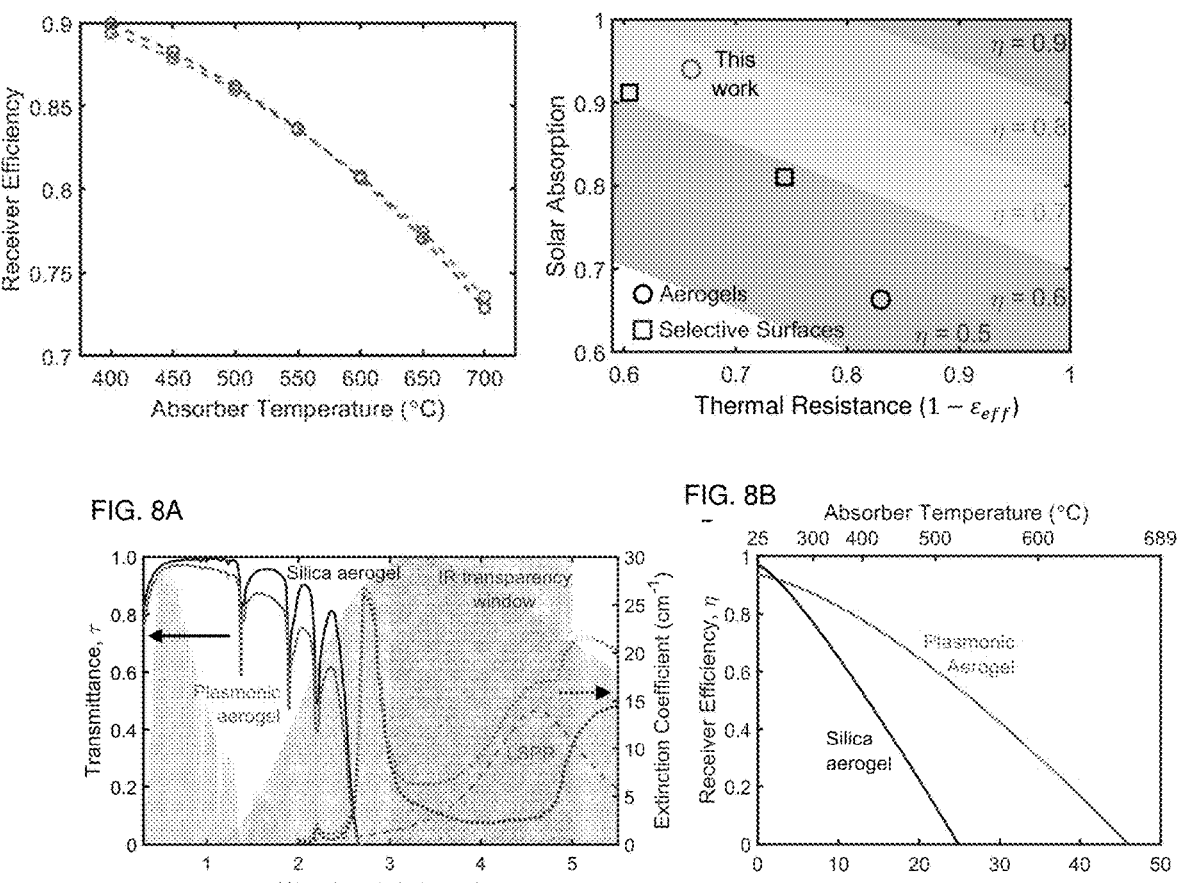
FIG. 7A illustrates the effect of absorber temperature on the receiver efficiency for mesoporous oxides of the disclosure (coated) and uncoated silica aerogels (uncoated).
FIG. 7B illustrates the thermal resistance of various materials, including mesoporous oxides of the disclosure (circles), and selective surfaces (squares).
FIG. 8A illustrates modeled optical transmittance and infrared absorption coefficient of silica aerogel ("aerogel", prior art) and mesoporous oxides of the disclosure having nanoparticles dispersed throughout the porous oxide matrix ("plasmonic aerogel").
FIG. 8B illustrates modeled dependence of the receiver efficiency on the dimensionless temperature under 10 suns of solar irradiance for a prior art silica aerogel and a mesoporous oxides of the disclosure having nanoparticles dispersed throughout the porous oxide matrix ("plasmonic aerogel").

Using the transmission spectra from FIG. 6A and the heat loss data from FIG. 13B, the efficiency of an evacuated sample after aging at 800° C. under an illumination of 100 suns at varying temperatures was estimated (FIG. 7A). Two trends were observed. The first was that uncoated samples were more efficient at lower temperatures. Thermal losses decreased at low operating temperatures, thus placing more emphasis on the solar transmittance of the sample. The second trend was that the coated sample was more efficient at higher temperatures. At higher temperatures, thermal losses were much more significant. The decrease in thermal losses greatly outweighs the 14% decrease in solar transmittance in the coated samples.

The mesoporous oxides of the disclosure were compared to selective surfaces, using a parameter space to compare the solar collection fraction and the outgoing thermal losses for each design (FIG. 7B). The results presented in FIG. 7B are at 700° C. and 100 suns. For selective surfaces, the collection factor was the solar-weighted absorptivity of the surface at 700° C. In FIG. 7B, the squares are selective surfaces, and the circle is the coated mesoporous oxide of the disclosure. For the mesoporous oxides of the disclosure, it is the solar-weighted transmittance because it is assumed the mesoporous oxides will be used with blackbody surfaces. Thermal losses from selective surfaces were defined by the IR emissivity multiplied by the blackbody emissive power at 700° C. Only materials with high temperature emissivity measurements (>700° C.) were included because the IR emittance of selective surfaces inherently increases at high temperatures and room temperature measurements would artificially inflate the performance. Regardless, the common theme of selective surfaces was that their IR emittance is too large at high temperatures—indicated by their placement to the left side of the parameter space. Alternatively, radiative shields such as porous silica provided greater resistance to heat losses while also maintaining high transparency. Furthermore, porous silica has low thermal conductivity due to their porous nature. This enables their efficient use at ambient pressure whereas selective surfaces are typically operated under vacuum to prevent conductive losses and degradation due to oxidation. However, while porous silica may initially perform well (i.e., >80%), at these conditions, the inherent degradation of pure porous silica prohibits their prolonged use at high temperatures. Therefore, the mesoporous oxides of the disclosure is the only material that performed well and demonstrated thermal stability at high temperatures.

Thermal Stability

In addition to the increase in performance, the mesoporous oxides of the disclosure demonstrated improved thermal stability compared to uncoated porous silica. The thermal stability of the samples was determined by measuring the change in area after annealing at high temperatures. Porous silica-only samples degraded at high temperatures because nanometer-scale silica particles agglomerated and reduced the total surface area. Applying the conformal coating to silica to form a mesoporous oxide of the disclosure slowed this shrinking process. The decrease in area of the coated samples was 55% less compared to the uncoated samples. Additionally, the stability of the coated samples increased IR absorption was tested by annealing the coated samples at 800° C. for 14 days, and measuring the heat losses again. After the anneal, heat losses through the coated sample was 9% higher than prior to aging but still 10% less than the uncoated sample.

To further understand the thermal stability of the mesoporous oxides of the disclosure, coated and uncoated aerogels were subjected to aggressive thermal aging in air (700° C. for 1 day and 800° C. for 14 days). The table below summarizes the improved thermal stability of the mesoporous oxides of the disclosure.

then repeated at 800° C. for a total of 20 days (FIG. 12B). The asymptotic rate of degradation of the aerogels (i.e. averaged over days 17-20 at 800° C.) showed stark differences. The ALD-coated aerogel's area decreased only 0.06%/day while the uncoated aerogel's area decreased 0.57%/day—demonstrating an order of magnitude improvement of the ALD-coated aerogel over the uncoated aerogel. The improvement in thermal stability is also reflected in the solar weighted transmittances (FIG. 12B). After annealing at 700° C. for 4 days, the transmittance of both aerogel samples increased slightly. After this 'burn-in' period, however, the ALD-coated aerogel demonstrated consistent solar-weighted transmittances while the uncoated aerogel experienced degradation in its transmittance. While the difference in solar weighted transmittance was 3% initially, the gap closed to less than 1% by the end of the aging process. The structural collapse of the uncoated aerogel decreased transmittance due to increased specular reflectance and scattering—consistent with previous literature. The scatter in the transmission data for the ALD-coated aerogel is due to differences in relative humidity during measurements. Overall, this time-resolved aging study confirmed that the mesoporous oxides of the disclosure (i.e., ALD-coated) demonstrates significant improvement in the thermal stability of the aerogels relative to non-coated aerogels and that the coated aerogels approach a steady state configuration after 14 days, while the uncoated samples continue to restructure.

ALD Coating Model and Partially Coated Mesoporous Oxides

Mesoporous silicas were prepared as the porous oxide matrix and coated with aluminum by ALD under various conditions (10×pulses and 20×pulses) to understand the diffusion-limited ALD penetration into and coating of the porous oxide materials.

| Sample | Density (kg/m³) | Porosity (%) | Surface area (m²/g) | Mean Scattering Diameter (nm) | Thermal conductivity (mW/m/K) |
|---|---|---|---|---|---|
| Coated, Initial | 230.5 ± 3.2 | 90.0 ± 1.2 | 662 | 8.3 | 18.6 ± 0.9 |
| Coated, Aged | 330.0 ± 9.0 | 85.7 ± 2.3 | 503 | 7.0 | 30.6 ± 1.5 |
| Uncoated, Initial | 174.6 ± 2.4 | 92.1 ± 1.3 | 716 | 8.6 | 15.3 ± 0.8 |
| Uncoated, Aged | 387.6 ± 4.5 | 82.4 ± 1.0 | 481 | 7.0 | 41.4 ± 2.1 |

Due to greater densification and structural degradation, the uncoated aerogels' density increases 122% compared to just 44% for the ALD-coated aerogel. Analogously, the aerogel area decreased only 20.6±3.3% for the coated aerogel compared to 38.4±1.1% for the uncoated (FIG. 12A). The significant degradation resulted in a higher density for the uncoated aerogel after aging despite the ALD-coated aerogel weighing ~25% more. Similar trends occur for the porosity, BJH desorption surface area, mean scattering diameter, and thermal conductivity. The ALD coating stabilizes the aerogel structure and maintains a structure closer to the original uncoated aerogel after aging with its higher porosity, surface area, and lower conductivity compared to the aged uncoated aerogel. Specifically, the thermal conductivity of the uncoated aerogel increases 171% compared to 65% for the ALD-coated aerogel.

Further studies were conducted using a more discretized thermal aging process: 700° C. with cycling down to room temperature (about 25° C.) after 1, 2, 4, 7, and 10 days and The diffusion-limited model treated the system similarly to a "vacuum pump" undergoing molecular flow, where the vacuum source is the deeper, uncoated portion of the pores. The diffusion limited model assumed constant precursor concentration outside the structure's pores and no mass transport limitations to the edge of the pore. Knudsen diffusion was assumed in the pore, where precursors only interact with the pore walls. A binary sticking coefficient was assumed, where a value of 1 (100% probability of reaction) was given for sites which had not reacted with a precursor molecule, while a value of 0 (0% probability of reaction) was given for sites which had reacted with a precursor molecule. This diffusion limited model assumes straight pores, so no tortuosity is included. Using these assumptions, the precursor flux $J$ [1/m2/s] at the ALD-coated front, located at a depth of A [m], is defined as the impingement flux on a flat surface modified by the Clausing factor:

25

$$J = \frac{P}{(2\pi mkT)^{\frac{1}{2}}\left(1 + \frac{3\lambda p}{16\,A}\right)} \quad (1)$$

where P [Pa] is the precursor partial pressure immediately outside of the pore entrance, m [kg] is the mass of one precursor molecule, k is the Boltzmann constant [1.38*10-23 J/K], T [K] is the deposition temperature, p [m] is the pore perimeter, and A [m2] is the pore cross-sectional area. Solving for the change in coating depth with time, the exposure required for complete coverage of the walls of the structure can be solved as:

$$Pt = S\sqrt{2\pi mkT}\left[4a + \frac{3}{2}a^2\right]; \quad (2)$$

$$a = \frac{Lp}{4A}$$

where P [Pa] is the precursor partial pressure outside the pore, t [s] is the exposure time, S [1/m²/s] is the saturation exposure (molecules/m², the number of reaction sites per substrate surface area), m is the mass of one precursor molecule, k is the Boltzmann constant, T is the deposition temperature, a is the aspect ratio, L [m] is the length of the pore, p is the perimeter of the pore, and A is the cross-sectional area of the pore. ALD coatings into porous oxides can be modeled by adding a tortuosity factor in the denominator of the aspect ratio (a) term, to decrease the expected penetration depth due to the tortuosity of the diffusion path. This was treated as a fitting parameter. The penetration depth of the ALD coating was evaluated using scanning electron microscopy (SEM) energy-dispersive x-ray spectroscopy (EDAX) by measuring the relative amounts of Al, Si, and O in the mesoporous oxides according to the ALD Penetration Depth Test described herein. The roughly cylindrical mesoporous oxides had two axial faces: concave and convex, as a side effect of the synthesis process. The concave side was consistently observed to have larger penetration depths than the convex side during the same coating process. Without intending to be bound by theory, it is believed that this difference was likely due to differences in the pore size distribution, porosity, or tortuosity. In the final analysis, only the convex side is used with experimentally measured (using BET) pore sizes and the tortuosity fitting parameter.

Yanguas-Gil et al. developed a model that incorporates a non-binary precursor reaction probability, which captures the gradient in precursor chemisorption at the coating front. For the ultra-high-aspect-ratio aerogels of the disclosure, the effect of including a non-binary reaction probability was found to be negligible.

While the diffusion-limited model and the Yanguas-Gil models describe an ALD process that has a single exposure step with negligible precursor depletion in the reaction chamber, additional considerations were necessary to describe the multi-dose-QSM procedure of the disclosure. To this end, a deposition model was developed to account for precursor depletion in the chamber during an exposure step, as well as the use of multiple doses of a single precursor before dosing the counter reactant.

Precursor diffusion inside of the aerogel pores is modeled in the molecular flow regime, while external transport limitations in the chamber are neglected. A 1D model is used, due to the large aerogel diameter relative to its thickness (>5:1). TMA dosing is assumed to be the rate-determining step in the ALD process due to its lower vapor pressure and diffusion coefficient compared to DI water, and its lower diffusion coefficient compared to species present (Ar, CH₄) during purging. Although TMA at 150° C. is a mixture of monomers and dimers, for simplicity, TMA is assumed to be monomeric. Dimeric TMA will have a lower diffusion coefficient than monomeric TMA, resulting in slower diffusion into the aerogel pores. As the monomeric TMA is consumed by the aerogel, dimeric TMA will dissociate to produce more monomeric TMA. The aerogel pore cross-section is considered to be circular on average, with a diameter of ~22 nm, which was calculated based on Brunauer-Emmett-Teller (BET) measurements. The random, tortuous network of pores of the aerogels are taken into account in the model using tortuosity.

The multi-dose-QSM procedure is depicted in FIG. 17. In the first exposure step, the precursor is dosed into the chamber and begins diffusing into the aerogel. Precursor reaction within the aerogel occurs at the ALD-coated reaction front, taking the form of step function due to the binary reaction coefficient. Using a tortuosity, t, the expression for precursor flux at the ALD-coated reaction front in the diffusion-limited model (Equation 1) is modified as:

$$J = \frac{P}{\tau(2\pi mkT)^{\frac{1}{2}}\left(1 + \frac{3\lambda p}{16\,A}\right)} \quad (3)$$

After a differential time step (dt), this flux results in a change in the ALD infiltration depth (dλ) as $$dt = \frac{SB}{J}d\lambda \quad (4)$$

where B [m²/m³] is the volumetric surface area of the aerogel. Owing to the hierarchical nature of the aerogel porosity, multiple pore length scales must be considered when modeling the complete coverage of the ALD coating. Specifically, there is a large fraction of relatively small mesopores (2-50 nm in diameter) that do not contribute significantly to diffusion deep into the aerogel, but still must be coated in a conformal ALD process. Therefore, volumetric surface area is used instead of a single pore surface area, in order to separate the average pore size (which is necessary for flux/diffusion calculations) from the total surface area available for deposition.

The quantity of precursor that is consumed during a differential time step can be calculated from the flux at the ALD-coated front and the Ideal Gas Law as follows:

$$JA_0\phi = \frac{dN}{dt} = \frac{\left(\frac{dP}{dt}\right)V}{N_v RT} \quad (5)$$

where $A_0$ [m²] is the projected surface area of the aerogel, φ is the porosity, N [1/m³] is the precursor concentration in the chamber, V [m³] is the volume of the chamber, $N_v$ [1/mol] is Avogadro's number, and R [J/mol/K] is the ideal gas constant. During the first exposure step, Equations 3-5 can be solved numerically when using a sufficiently small time-step, in this case 1 ms.

After the first exposure step, the depth of the ALD coating inside the structure ($\lambda_1$) is calculated based on the exposure time and initial precursor dose. The remaining precursor and any reaction products are purged from the chamber (FIG. 17C) and the second dose is supplied (FIG. 17D). At the start of the second dose, there is no precursor within the pores. Diffusion from the chamber to the reaction front must occur. During this step, the precursor concentration field is re-equilibrated rapidly compared to the time needed to change the diffusion path length (FIG. 17E). This can be appreciated by noting that the average velocity of the reaction front ($d\lambda/dt$) is approximately $5*10^{-4}$ mm/s (FIG. 18B), while the characteristic velocity associated with precursor diffusion to the front ($D_{eff}/\lambda$) is 1 mm/s, where $D_{eff}$ is the effective diffusion coefficient of the precursor within the pore. Similarly, a steady state concentration profile of the product species ($CH_4$) is also established relatively fast. Thus, to excellent accuracy, transport can be modeled by pseudo-steady-state diffusion to the moving reaction front, represented by Equations 3-5. The relatively slow velocity of the reaction front is a consequence of the large volumetric surface of the aerogel pores, as discussed above. The overall mass transport rate is, thus, controlled by pseudo-steady diffusion through the long, tortuous pores, and not by the precursor reaction rate.

The model outputs are shown in FIG. 18. The TMA partial pressure in the chamber (FIG. 18A) is displayed with respect to cumulative exposure time. The partial pressure decreases with respect to time in each individual exposure step due to precursor consumption by reaction sites within the aerogel. At the endpoint of each sequential 400 s exposure step, the partial pressure of TMA remaining in the chamber monotonically increases. This illustrates that the percentage of precursor used to coat the AM is very high in the first dose, but it decreases in subsequent doses.

FIG. 18B shows the model results for the incremental increase in infiltration depth ($\lambda_{1-4}$), which decreases with each subsequent dose. The reason for this trend is that the precursor molecules must diffuse progressively deeper into the aerogel to supply the necessary reactant flux. Consequently, precursor utilization decreases with each subsequent exposure step (FIG. 18A).

In this model, the tortuosity ($\tau$) is treated as a fitting parameter, owing to the difficulty in experimentally evaluating this value in a random aerogel network. A $\tau$ value of 1.8 yielded good agreement between the modeled and experimentally-measured infiltration depths (FIG. 17) for a series of recipes with varying exposure times per dose (FIG. 18C) and number of doses (FIG. 18D). This T value is consistent with previous publications on aerogels and other substrates with similar porosities and pore sizes. $\tau$ was varied between 1.5 and 2.1 to investigate its effect on the agreement between the model and the experimental data. Although the modeled infiltration depths vary somewhat depending on $\tau$, the trends are consistent regardless of the exact value.

The agreement between the modeled and experimental data enables the prediction of the process parameters necessary to reach a certain infiltration depth into an aerogel. While the exact deposition conditions presented here are a function of the reactor volume as well as the substrate and precursor properties, the model allows for generalization to an arbitrary reactor, deposition process, and substrate geometry. This framework is important for the efficient development of new ALD processes on ultra-high-aspect-ratio substrates.

The model further allows for the quantification of important ALD process characteristics, including the total process time (FIG. 19). Total process time is defined as the sum of all exposure and purge times, and does not include initial bake-out and water pre-cycle times. In order to achieve a fixed infiltration depth (1.25 mm) using the multi-dose-QSM method, increasing the total number of doses enables a lower exposure time per dose (e.g. 5 doses: 712 s, 10 doses: 178 s, 15 doses: 105 s, 20 doses: 75 s, 25 doses: 58 s). This results in a lower total process time, decreasing from greater than 5.5 hours to less than 3 hours when the total number of doses increases from 5 to 25.

This observation can be rationalized by the fact that when increasing the number of doses and decreasing the exposure time per dose, the precursor partial pressure in the ALD chamber decreases less significantly during each exposure step. When using a very large number of doses, the process approaches a constant-flow regime, where depletion of precursor in the reaction chamber is negligible. Maintaining constant precursor partial pressure in the chamber helps to mitigate diffusion limitations. However, as shown in FIG. 19, there are diminishing returns in terms of limiting the total process time when increasing the number of doses and decreasing the exposure time per dose.

In addition to total process time, the percentage of unreacted precursor can also be calculated (FIG. 19). When using a low number of doses and a very long exposure time per dose, nearly all of the precursor in the chamber has time to diffuse into and react with the aerogel, resulting in low levels of wasted precursor (<30%). Alternatively, when approaching the regime of constant precursor partial pressure in the chamber, large amounts of precursor are not utilized due to the necessary short exposure time per dose and are thus purged directly into the vacuum pump. This results in precursor waste levels exceeding 80%. These low levels of usage are exacerbated by the large amount of precursor needed to conformally coat high surface area, ultra-high-aspect-ratio structures. After evaluating the trade-off between total process time and percentage of unreacted precursor in FIG. 19, ~12 precursor doses were selected to fully coat the samples used in FIGS. 15, 16, 18, and 19.

In addition to diffusion limitations, the ALD coating process can also be reactant limited. This occurs when the total number of reaction sites on the porous oxide is greater than the number of available precursor molecules before the counter reactant is pulsed into the chamber.

ALD Coating Uniformity in Fully Coated Aerogels

EDS line scans were used to determine the uniformity of the ALD coating by evaluating the relative signals of the elements in the mesoporous oxide. Scans were performed from just above the concave side of the aerogel (low distance values) to just below the convex side (high distance values).

Preliminary investigations into the effect of exposure time and number of half-cycles, corresponding to precursor dose were performed (FIG. 5). In all cases, 1 cycle of ALD alumina was performed on a silica matrix. Using 30 or fewer pulses/half-cycles of each counter reactant, the Al/Si ratio was relatively low, suggesting that the ALD coating may not be saturated. This ratio appeared asymptotic between 45 and 60 pulses, suggesting ALD saturation. The uniformity in the coating also appeared to improve with exposure time, demonstrated by a flattening of the Al/Si ratio through the cross section. As shown in FIG. 15, further investigations revealed that the entire aerogel monolith can be fully and conformally coated by using a sufficiently large number of precursor doses and long exposure times per dose. The accompanying scanning electron microscopy/energy-dispersive X-ray spectroscopy (SEM/EDS) line-scans in FIG. 15 show the atomic percentages of Al, Si, and O with respect to distance from the surface of the AM. The coated regions of the AM cross-sections exhibit a constant atomic percentage of Al (10±1.5 at %) and thus a constant Al/Si ratio. This indicates that these regions do, in fact, experience self-limiting surface reactions with the precursor, as the atomic percentage of Al does not continue to increase with respect to exposure time per dose and number of doses.

Surface saturation is an important aspect of every ALD process. In most studies on planar substrates, saturation is evaluated by varying the pulse and/or exposure times of the precursors and measuring the thickness increase per cycle. Alternatively, in the case of a sufficiently high-surface-area substrate, the total mass gain after ALD can also be measured ex situ and used to evaluate saturation behavior. The second approach was used to confirm the self-limiting nature of a single ALD cycle throughout the bulk AM volume under multi-dose-QSM.

In the preliminary studies, the masses of the silica matrices were recorded before depositing the ALD coating without performing a bake-out step prior to measurement. Masses were recorded again immediately after the ALD coating (within 5 minutes after removal from the chamber), while atmospheric water vapor was still adsorbing on the aerogel surface. These two values were compared, and the percentage of mass gain was evaluated (Table 1), showing approximately equal mass gains in samples with full penetration. By using these two measurements, the mass gain percentage was slightly underestimated due to initial water adsorbed on the silica surface prior to deposition. After baking out the silica for 1 hour in the ALD chamber at 150° C., the mass decrease was ~1.8%. Continued bake-out for several hours in the ALD chamber revealed only small decreases in mass compared to the first hour. Differences in mass gain in Table 1 could be due to differences in ambient humidity at the time of mass measurement.

| DEPOSITION CONDITION | MASS GAIN (%) |
|---|---|
| 23 PUL., 210 S EXP. | 24.2 |
| 45 PUL., 400 S EXP. | 24.4 |
| 60 PUL., 400 S EXP. | 23.0 |

In FIG. 16, the mass gain of a series of AM samples with varying exposure times and number of doses is shown. To minimize the effects of water adsorption, the initial mass of the AM was measured after allowing the sample to bake out under vacuum for at least 1 hour at 150° C. The ALD-coated AM mass was measured using an analytical balance within 1-2 minutes after removal from the ALD chamber. The initial AM mass was ~75 mg. Mass gain is shown to initially increase with respect to exposure time per dose and number of doses and eventually saturate at ~27%. Under these saturated conditions, the AM has been fully coated by ALD, as shown in FIG. 15. Importantly, further increases in either exposure time per dose or number of doses does not result in a further increase in the mass gain, demonstrating saturation and self-limiting behavior in the ALD process.

The expected saturated mass gain after complete coating of the AM can be approximated using the AM specific surface area, ALD thickness growth per cycle, and $Al_2O_3$ density. The theoretically-predicted mass gain value of ~38% after complete coating is slightly higher than the measured value of ~27%. Furthermore, the expected atomic composition percentage of Al can be calculated using the trimethylaluminum (TMA) saturation dose, i.e. the number of TMA molecules that can chemisorb per substrate surface area. After one conformal ALD cycle, the predicted Al atomic percentage is 13%, which is slightly higher than the experimental value of ~10% in the ALD-saturated regions of the AMs (FIG. 15). The differences in both of these predictions could be attributed to several factors, including differences in the saturated growth per cycle and density during the first ALD cycle compared to steady-state growth values based on measurements of "bulk" ALD films after >100 cycles. Overall, these theoretical calculations are in good agreement with the observed saturation trend in FIG. 16.

Experimentally Measured ALD Infiltration Depths on Concave and Convex Sides

Experimentally measured infiltration depths can be used to parameterize the deposition model. Approximately one quarter of an aerogel was coated in each case. The infiltration depths on the convex side are used to parameterize the model.

Due to the aerogel drying mold, there is one concave and one slightly convex side of the aerogel. As shown in the below table, during deposition, the concave side consistently had 10-30% deeper infiltration than the convex side. This is likely due to differences in nanostructure properties (porosity, pore size, tortuosity, or specific surface area) which result in different diffusion and/or reaction behavior. For simplicity, only infiltration depths on the convex side are used.

| NUMBER OF DOSES | EXPOSURE TIME + DOSE TIME (S) | INFILTRATION DEPTH, CONVEX (MM) | INFILTRATION DEPTH, CONCAVE (MM) |
|---|---|---|---|
| 1 | 402.5 | 290 | 310 |
| 2 | 402.5 | 520 | 680 |
| 5 | 402.5 | 1110 | 1210 |
| 8 | 402.5 | FULLY COATED | FULLY COATED |
| 12 | 17.5 | 480 | 570 |
| 12 | 32.5 | 650 | 750 |
| 12 | 62.5 | 840 | 1010 |
| 12 | 182.5 | FULLY COATED | FULLY COATED |
| 12 | 402.5 | FULLY COATED | FULLY COATED |

Expected Mass Gain and Atomic Percentage of Aluminum

ALD monolayer density were measured using X-ray reflectivity (XRR). About 40 nm of $Al_2O_3$ was deposited on a planar, nanostrip-cleaned $SiO_2$ substrate. Prior to ALD, substrates were cleaned using air plasma (Harrick Plasma, PDC-001-HP plasma cleaner). This treatment was performed at 40 mTorr and 10.2 watts for 10 minutes. The average density was found to be 3.24 g/cm³, the average thickness was found to be 37.0 nm, and the average roughness was 0.9 nm.

The growth per cycle for ALD was measured by spectroscopic ellipsometry of ALD $Al_2O_3$ on a planar $SiO_2$ surface.

Assuming the deposited ALD monolayer has the same density ($\rho_{Al2O3}$, 3.24 g/cm³) and growth per cycle (GPC, 1.4 Å/cycle) as a bulk ALD $Al_2O_3$ film, the expected mass gain from one cycle can be calculated from the following equation:

$$\% \ MG = SSA*GPC*(1 \ cycle)*\rho_{Al2O3}*100\%$$

where SSA is the specific surface area of the $SiO_2$ aerogel (838 m²/g). The expected mass gain is calculated as 38% after one conformal ALD cycle.

The expected atomic ratio of Al:Si from one ALD cycle can be approximated using the following equation:

$$\frac{mol_{Al}}{mol_{Si}} = S_{TMA}*SSA*\frac{1 \ atom \ Al}{1 \ mlcl \ TMA}*$$
$$\frac{1 \ mol \ Al}{6.022 \ E23 \ atom \ Al}*\frac{60.08 \ g \ SiO_2}{1 \ mol \ SiO_2}*\frac{1 \ mol \ SiO_2}{1 \ mol \ Si}$$

where $S_{TMA}$ is the TMA saturation dose, i.e. the number of TMA molecules that can chemisorb per substrate surface area. Each adsorbed TMA molecule contributes one Al atom to the film. This ratio of Al:Si atoms is calculated as 0.44:1. Using these calculations and the atomic percentage of Si in the ALD-coated regions (30%, FIG. 15), the expected atomic percentage of Al after 1 conformal ALD cycle is 13%.

The variations in both mass gain (measured: 27%, predicted: 38%) and atomic percentage of Al (measured: ~10%, predicted: 13%) could be due to uncertainties the TMA saturation dose ($S_{TMA}$) value. This value is calculated using ALD $Al_2O_3$ film density and growth per cycle (GPC) values under steady state growth. Specifically, planar $SiO_2$-terminated Si substrates were used, and films were grown using >100 ALD cycles. The film density and GPC values may be different during ALD nucleation compared to steady-state growth. The difference in substrate (aerogel and planar Si) may also result in some differences in $S_{TMA}$, although both substrates have $SiO_2$ surfaces.

The saturation dose of TMA on a planar Si substrate can be approximated using the following equation:

$$S_{TMA} = GPC*\rho_{Al2O3}*(1 \ cycle)*\frac{m_{Al-Al2O3}}{m_{Al2O3}}*$$
$$\frac{1 \ mol \ Al}{m_{Al}}*\frac{6.022*10^{23} \ atom \ Al}{1 \ mol \ Al}*\frac{1 \ mlcl \ TMA}{1 \ atom \ Al}$$

where GPC is the $Al_2O_3$ growth per cycle (1.4 Å/cycle), $\rho_{Al2O3}$ is the bulk density of ALD $Al_2O_3$ (~3.2 g/cm³), $m_{Al-Al2O3}$ is the mass of Al in $Al_2O_3$ (53.96 g/mol), $m_{Al2O3}$ is the molar mass of $Al_2O_3$ (101.96 g/mol), and $m_{Al}$ is the atomic mass of Al (26.98 g). The density was measured using XRR. $S_{TMA}$ is calculated as $5.3*10^{18}$ reacted TMA molecules/m² of Si. This value is assumed to be approximately the same for the first cycle of ALD $Al_2O_3$ on silica aerogels. The $Al_2O_3$ nucleation growth per cycle and density on aerogels are assumed to be the same as the steady-state growth on planar substrates.

Implications of Conformal ALD Infiltration

The ability to predict and control ALD infiltration depth into an aerogel or other ultra-high-aspect-ratio substrate is useful for a wide range of applications. As an example, in the heterogeneous catalysis and thermal insulation fields, structural stability at high temperatures is an important material property. In the case of silica aerogels, densification typically occurs at temperatures beyond 700° C., which is driven by a minimization of surface energy. This results in a decrease in the aerogel size and specific surface area, as well as a change in the pore size distribution, which affects the application potential of these materials beyond 700° C.

A visualization of this densification process in a bare silica aerogels is shown in FIG. 20A-B, where the 3-dimensional profile of the aerogel was measured using focus variation microscopy. The aerogel densifies in both the radial and axial directions after annealing. The densification is tracked with respect to annealing time by measuring the change in average normalized monolith diameter (FIG. 20C). All of the samples shrink significantly after the first 8 hours of annealing, but the fully-coated aerogels contract 38% less at 700° C. and 41% less at 800° C. compared to uncoated samples. When annealing for a further 16 hours at 700° C., the coated aerogels show improved long-term stabilization, decreasing in normalized diameter by 0.02%/hr, while the uncoated aerogels decrease by 0.04%/hr. At 800° C., the coated and uncoated aerogels contract on average by 0.07%/hr and 0.23%/hr, respectively. This demonstrates improved thermal stability in the ALD-coated aerogels.

To further quantify the densification of the aerogels, the specific surface area per gram of silica ($SSA_{SiO2}$) was measured by BET analysis. $SSA_{SiO2}$ was quantified as a function of annealing time at 800° C. for both uncoated and conformally-coated samples (FIG. 20D). Similar results were observed when annealing at 700° C. There is an initial decrease in the $SSA_{SiO2}$ of the coated aerogel from the ALD process, possibly due to blocking of very small pores. However, after this initial drop, the conformally-coated aerogel is more resistant to high-temperature sintering and subsequent decreases in $SSA_{SiO2}$. After 8 hours of annealing, the uncoated aerogel $SSA_{SiO2}$ decreases by 41%, while the coated aerogel decreased by 17% relative to the uncoated aerogel. Subsequent annealing up to 24 hours yields decreases in $SSA_{SiO2}$ at an average rate of 1%/hr of original $SSA_{SiO2}$ in the uncoated aerogel, while the rate of decrease in the coated aerogel appears negligible within the resolution capabilities of the BET analysis. Therefore, although the ALD coating results in an initially lower $SSA_{SiO2}$, after only 24 hours of annealing, the coated aerogel maintains a higher $SSA_{SiO2}$ than the uncoated sample. This represents a significant improvement in the high-temperature structural stability of silica aerogels, enabled by conformal ALD $Al_2O_3$ coatings.

Silica aerogels are composed of a network of interconnected nanoparticles (NPs). Under high-temperature annealing conditions, structural relaxation and NP movement is enabled by decreased NP viscosity. This nanoscale rearrangement, together with increases in bulk aerogel density, result in a decrease the aerogel SSA. The improved resistance to SSA degradation in the ALD-coated aerogels demonstrates that NP movement is suppressed. This can be attributed to decreased surface and/or bulk diffusivity as a result of the ALD coating. Analogous behavior has been observed in studies of applying ALD "overcoats" to heterogeneous catalysts, which enhance sintering resistance at elevated temperatures. Overall, conformal ALD $Al_2O_3$ coatings enable multi-scale structural stabilization of the aerogel structure, both on the macro- and nano-scales. This makes conformal ALD modifications on aerogels attractive for applications where high-temperature stability of high-surface-area structures is necessary.

Greenhouse Selectivity Definition and Relation to Receiver Efficiency

A quantitative measure of greenhouse selectivity, $\Gamma$, can be given by:

$$\Gamma = \tau\beta l \tag{2}$$

where $\tau$ is the solar-weighted transmittance of the TIM, $\beta$ is the Rosseland weighted absorption coefficient, and $l$ is its thickness. This definition of greenhouse selectivity shares similarities with those in the art, but is more appropriate for modeling TIMs that are opaque to thermal radiation. In particular, $\Gamma$ is directly related to the maximum temperature that a solar receiver can achieve, $T_{max}$, also known as the stagnation temperature, and hence describes the entire temperature-dependence of the solar thermal conversion efficiency ($\eta$) (as shown below). This assumes a configuration where the TIM is in thermal contact with a blackbody absorbing surface on one side and exposed to the surroundings on the other.

The heat collected by a solar receiver, Q, depends on the amount of solar radiation transmitted by the TIM to the absorber and the thermal losses to the environment $Q_{loss}$. The energy that reaches the absorber is given by $\tau C G_s$, where $\tau$ is the solar-weighted transmittance of the TIM, C is the solar concentration ratio, and $G_s$ is the standard AM1.5D incident solar power (~1,000 W m$^{-2}$). Meanwhile, heat losses are a function of the absorber temperature $T_{abs}$ and the thermal resistance of the TIM. For selective surfaces (ss) in an evacuated enclosure, heat losses are entirely radiative and given by:

$$Q_{loss}^{ss} = \varepsilon_{eff}\sigma(T_{abs}^4 - T_\infty^4) \tag{3}$$

where $\varepsilon_{eff}$ is the effective thermal emittance, which is temperature dependent, and $T_\infty$ is the ambient temperature (~300 K). For "good" TIMs, on the other hand, where radiation is the dominant heat transfer mechanism at high temperatures (no conduction) and we are concerned with infrared opaque materials ($\beta l >> 1$), it is more physically meaningful to express the heat losses using the Rosseland Approximation[41]:

$$Q_{loss}^{TIM} \cong Q_{Rosseland} = \frac{16\sigma \overline{T}_{eff}^3}{3\beta}\left(\frac{T_{abs} - T_\infty}{l}\right) \tag{4}$$

Here, $\overline{T}_{eff}$ is the effective mean temperature of the TIM. This formulation shows that the resistance to thermal radiative transfer, $R_{TIM}$, scales with the thermal opacity, $\beta l$, that is $Q_{loss} \sim 1/\beta l$. In the calculation of greenhouse selectivity in the radiative limit ($\Gamma$), both $\tau$ and $\beta$ are weighted values over the solar and blackbody spectra, respectively.

The maximum temperature the absorber can reach ($T_{max}$) occurs when the transmitted radiation is balanced by the heat lost to the environment (i.e., Q=0). When a dimensionless (Rosseland) temperature is defined as:

$$\Phi = \frac{16\sigma \overline{T}_{eff}^3}{3}\frac{T_{abs} - T_\infty}{G_s} \tag{5}$$

it can be seen that the dimensionless maximum temperature, $\Phi_{max}$, is equal to the product of the solar concentration ratio and the greenhouse selectivity:

$$\Phi_{max} = C\Gamma \tag{6}$$

The above formulation demonstrates that increasing greenhouse selectivity is, in effect, equivalent to increasing solar concentration because they both enable higher $T_{max}$. For example, at a solar concentration of 10 suns such that $CG_s = 10,000$ W m$^{-2}$, a TIM with $\Gamma = 2$ reaches a maximum absorber temperature of ~480° C. Meanwhile, a TIM with $\Gamma = 5$ reaches a max temperature of ~690° C. Alternatively, one would need to increase the solar concentration from 10 to 25 suns to produce the same increase in $T_{max}$ for a fixed $\Gamma = 2$. This is significant as it shows that increasing the greenhouse selectivity is a direct alternative to high solar concentrations. Increasing selectivity, however, offers two potential advantages over increasing solar concentration: (i) it reduces the need for expensive and optically inefficient focusing designs, and (ii) lowering C decreases the temperature difference between the absorber and the heat transfer fluid, which consequently improves the efficiency of the power block.

Furthermore, using definition of greenhouse selectivity set forth herein, the entire temperature-dependence of the solar thermal conversion efficiency ($\eta$) in the radiative limit is fully described once $\tau$, $\Gamma$, and C are specified (Eq. 5). The efficiency curve intercepts the y-axis at $\tau$ because thermal losses approach zero at the temperature of the surroundings. $\eta$ intercepts the x-axis at CF when thermal losses are balanced by the incoming solar flux.

$$\eta = \tau - \frac{Q_{loss}}{CG_s} = \tau\left(1 - \frac{\Phi}{C\Gamma}\right) \tag{7}$$

The above framework is valid for real TIMs, which have additional heat loss due to conduction, if $\Gamma$ is replaced by the effective greenhouse selectivity $\Gamma_{eff}$, which can be determined according to Eqs. 2 & 4 using a measurement of solar transmittance and experimental heat loss.

Theoretical Description of the Enhanced Greenhouse Effect in the Radiative Limit The optical properties of a 5 mm thick, 160 kg m$^3$ dense mesoporous oxide of the disclosure with a porous silica matrix and dispersed transparent conducting oxide nanoparticles was modeled. Transparent conducting oxide nanoparticles (TCO NPs) were chosen because of their known ability to transmit sunlight and absorb strongly in the infrared due to mid-infrared localized surface plasmon resonances (LSPRs). The permittivity of the nanoparticles is assumed to be well described by a Drude model:

$$\epsilon = \epsilon_\infty - \frac{\omega_p^2}{\omega^2 - \omega\Gamma i} \tag{8}$$

where $\epsilon$ is the permittivity, $\epsilon_\infty$ is the core dielectric constant, $\omega$ is the radial frequency of light, $\omega_p$ is the plasma frequency, and $\gamma$ is the damping coefficient. Parameters representative of bulk TCOs were chosen for the Drude model and applied a nanoscale size dependence to the damping coefficient. On their own, TCO NPs showed relatively low solar attenuation and an infrared absorption peak around 4.5 microns due to the LSPR (based on a Rayleigh description of absorption and scattering cross-section). This peak aligned well with the transparency window of silica aerogels (FIG. 8A).

Using the modeled TCO NP extinction coefficients and the previously reported extinction coefficients of unaltered silica aerogels, the solar transmission and infrared extinction of a silica aerogel with TCO NPs dispersed at a volume fraction of 0.02% was modeled (FIG. 8A). The results showed that solar transmission was slightly reduced because of Rayleigh scattering at short wavelengths and absorption from the LSPR tail in the near-IR. Meanwhile, the absorption coefficient within the mid-IR transparency window increased almost three-fold with the addition of the TCO NPs. A three-fold improvement in thermal absorption was important because it lead to a corresponding decrease in radiative heat losses per Eq. 2.

FIG. 8B shows the theoretical improvement in receiver efficiency (in the radiative limit) at elevated temperatures due to the addition of TCO NPs. The curvature in this plot was due to a temperature dependence of p. Based on the radiative limit, $T_{max}$ was estimated to increase from 526° C. to 668° C. under 10 suns ($<D_{max}$ increased from 25 to 46). The modeling therefore shows that plasmonic nanoparticles can significantly increase r and allow solar collectors to achieve higher maximum temperatures and efficiencies.

Experimental Demonstration of the Enhanced Greenhouse Effect

Mesoporous oxides of the disclosure including silica as the porous oxide and indium tin oxide nanoparticles as the metal oxide nanoparticle dispersed therein were prepared as follows. Indium tin oxide (ITO) nanoparticles having an average particle size of 18-nm were dispersed in increasing volume fractions (up to 0.024%) in a silica sol-gel solution. The sol-gel solution was prepared as follows. Two solutions were prepared, a tetramethylorthosilicate (TMOS) diluted in methanol (MeOH) and an ammonia in DI water. The two solutions were mixed in plastic syringes where gelation occurred. For the mesoporous oxides including nanoparticles, drops of dispersed ITO nanoparticles in ethanol were added to the water-ammonia solution before mixing. Once the wet gels formed, they were aged for 1 week with daily ethanol washes to remove contaminants and water. The resulting mesoporous oxides with nanoparticles and comparative silica-only aerogels were dried using $CO_2$ critical point drying (CPD, model 915B, Tousimis, or equivalent). Upon drying, the mesoporous oxides and comparative aerogels were annealed at 400° C. for 24 hours to remove any organic contaminants or surfactants.

The mesoporous oxides were 3.5 mm thick. The small volume fraction of NPs negligibly affected the density of the porous oxide matrix, which was approximately 160 kg m$^{-3}$ for all samples. Similar to the TCO NPs modeled above, the ITO NPs had an LSPR at approximately 5 microns. Notably, the highest volume fraction of TCO NPs (0.024%) eliminated the undesirable mid-IR transparency window (FIG. 9A). By adding the measured extinction coefficient of the ITO NPs to literature silica aerogel extinction coefficients, #(at 700° C.) was estimated to increase from 7.2 to 18.2 cm$^{-1}$. Meanwhile, the measured solar weighted transmittance decreased from 0.95 (without NPs) to 0.70 (at the highest volume fraction). Aggregation of ITO NPs is largely responsible for this observed decrease in τ. This aggregation can likely be avoided with further optimization of the synthesis procedure. Nevertheless, the increase in infrared absorption from the ITO NPs outweighs the decrease in solar transmittance, resulting in higher Γ. In the radiative limit, the models showed that the addition of plasmonic nanoparticles increases the greenhouse selectivity of the aerogel from 2.3 to 4.5 which translates to an increase in $T_{max}$ from 506° C. to 661° C. under 10 suns (FIG. 9B). This calculation assumed negligible conduction and that the radiative properties of the aerogel and NPs were independent of temperature.

To experimentally determine the effective greenhouse selectivity of the mesoporous oxides of the disclosure having nanoparticles dispersed throughout the porous oxide matrix, which accounts for conduction through the solid (silica) network and the temperature-dependence of the thermal absorption coefficient, the temperature-dependent heat losses of the samples with increasing ITO volume fraction was measured using the calorimetric setup shown in FIG. 10A. The samples were placed under vacuum (<0.3 torr) and interposed between a variable temperature hot stage and a cold, temperature-controlled black surface maintained at ~30° C. A commercially available heat flux sensor in contact with the cold side records its voltage drop which is then converted to heat flux (FIG. 101B). Additionally, the samples were stable at 700° C. for the duration of the experiment.

FIG. 10C shows the reduction in heat losses with increasing ITO volume fraction. Notably, a nearly two-fold reduction in heat losses (at 700° C.) was observed for the highest ITO volume loading relative to the baseline aerogel, which had no nanoparticles included. The decrease in the heat flux was attributed to the plasmon-enhanced suppression of radiative transfer since the addition of NPs had no noticeable effect on thermal conductivity. In effect, the increase in infrared absorption from the ITO NPs decreased the mean free path of thermal radiation, resulting in decreased radiative heat transfer. These measurements provided validation that radiative losses were indeed significant at elevated temperatures in silica aerogels and can be significantly supressed via inclusion of the TCO nanoparticles. Furthermore, the experimental data showed excellent agreement with the numerical heat transfer model which rigourously combined the radiative transfer equation (RTE) with the heat transfer equation (HTE).

Heat Transfer Properties

Radiative heat flux reaching an absorbing sensor placed on the cold-side of an aerogel was measured as the silicon carbide surface, referred to as the "absorber," was heated in a vacuum stage.

Before aging, both the mesoporous oxide of the disclosure (i.e., an ALD-coated aerogel) and an uncoated aerogel showed similar heat loss rates—e.g. ~18 kW/m2 when the absorber was at 700° C. (FIG. 13B). After aging, however, the ALD-coated aerogel exhibited lower heat fluxes. The thermal degradation of the uncoated aerogel was evident because its thermal losses increased 24.1±4.2% compared to 9.5±4.2% for the ALD-coated aerogel.

The reduction in heat losses at these high temperatures relative to the uncoated aerogel can be explained by two effects: (1) the coated aerogel has a lower thermal conductivity (as discussed above), and (2) there is a reduction in radiative transfer associated with an increase in infrared absorption within the ALD-coated aerogels. This absorption is due to water adsorbed onto the ALD-coated aerogels. To confirm this, temperature-dependent DRIFTS measurements (FIG. 13C) and thermogravimetric analysis data were recorded for the aerogels after aging. The uncoated silica aerogels became hydrophobic after aging which is associated with the desorption of water and surface condensation reactions of silanol groups. In contrast, ALD-coated aerogels retained their hydrophilic nature even after prolonged aging above 700° C. This interesting behavior is most likely due to the strong Lewis acidity of unsaturated surface aluminum sites which readily adsorb water up to at least 600° C. TGA and FTIR data confirmed the presence of water up to 400° C. for ALD-coated compared to no water on aged uncoated samples, which suggests stronger adsorption of water. This temperature-dependent water absorption caused the ALD-coated aerogel to absorb more infrared radiation at colder temperatures than at its 'dry' state at 550° C. This effect was confirmed with high temperature emissivity measurements (FIG. 13D). The aerogels were placed on the hot stage and the emission from the aerogels through an IR-transparent KBr lid was measured. FIG. 13D shows that emission through the ALD-coated aerogel was less within the aerogel transparency window (3-5 μm). Moreover, the emission through the uncoated aerogel in the 3-5 μm window was nearly equal to the emission from the hot stage, indicating the uncoated aerogel was almost fully transparent in that region. For the ALD-coated aerogel, the presence of a significant temperature gradient across the aerogel allowed some water to be retained in the colder regions of the aerogel and in turn, block emission. Modeling results suggest that the cold side of the uncoated aerogel is as low as 275° C. At this temperature, the ALD-coated aerogels may keep enough adsorbed water to suppress thermal losses even when the hot side is 700° C.

EXAMPLES

Aerogel Synthesis

Aerogels were synthesized via a sol-gel polymerization of tetramethylorthosilicate (TMOS, 218472, Sigma-Aldrich) with DI water and ammonia (NH₃, 341428, 2.0M in methanol, Sigma-Aldrich) as the catalyst. Two solutions were prepared; TMOS was diluted in methanol (MeOH, 322415, Sigma-Aldrich), and an ammonia solution was added to DI water. The two solutions were then mixed in plastic syringes where gelation can proceed. Once the wet gels formed, they were aged for 1 week with daily ethanol washes to remove contaminants and water. The aerogels were then dried using CO₂ critical point drying (CPD, model 915B, Tousimis, or equivalent).

To remove any remaining contaminants and adsorbed water, the aerogels were annealed at 400° C. in air for 24 hours. The annealed aerogels measured approximately 25 mm in diameter, with thicknesses of 2-3 mm. One side of each aerogel was slightly concave, while the other was slightly convex due to the curvature of the meniscus. The bare aerogels had densities of about 0.20 g/cm³, calculated using mass balance and monolith volume measurements.

Formation of Mesoporous Oxide by Atomic Layer Deposition (ALD)

ALD deposition of Al₂O₃ films on the aerogels was performed in a custom hot-walled, cross-flow ALD reactor. Trimethylaluminum (TMA, 663301, Sigma-Aldrich) and deionized (DI) water were used as ALD precursors. Both precursors were kept at 37° C. in order to slightly boost their vapor pressures, and the reactor temperature was maintained at 150° C. In the exposure recipe, there were two steps in every cycle: exposure and purging. During the exposure step, the vacuum valve was closed, the Ar flow rate was reduced to 10 sccm, and the ALD precursor was pulsed into the chamber. 400 s was allowed for the ALD precursors to diffuse into the aerogel monolith. For the purging step, the vacuum valve was reopened, and the Ar flowrate was increased to 70 sccm. This step lasted 800 s. TMA was the rate-limiting reactant, and the TMA partial pressure in the chamber at the start of each exposure step was ~17 Torr. The precursor pneumatic valve actuation times were 2.5 s and 1.5 s for TMA and DI water, respectively.

Before depositing Al₂O₃, the aerogels were held at a vacuum pressure of 600 mTorr under constant Ar purging for at least 1 hour at 150° C. to ensure removal of excess water and other adsorbed species. The time for the aerogel to reach thermal equilibrium with the ALD chamber was found to be on the order of 1 minute. Prior to goating the aerogels, 5 DI pre-cycles were then performed to saturate the aerogel monolith to ensure hydroxyl termination on the aerogel surface. The same number of doses (12) are used for TMA and DI water. In the multi-dose-QSM recipes used in this work, a single precursor was sequentially dosed and purged multiple times before dosing the counter reactant.

Thermal Aging

The aerogels were annealed in a tube furnace (MTI Corporation, or equivalent) with a 2° C./min ramp rate in ambient conditions. The holding times for each temperature excluded the time to ramp up and down.

Optical Property Measurement

The solar direct-hemispherical transmittance of the aerogels was measured with a UV-Vis-NIR spectrophotometer (Shimazdu UV-3600 Plus, or equivalent) and an integrating sphere attachment (Shimazdu, ISR-603, or equivalent). The infrared transmission measurements were obtained with a Fourier transform infrared (FTIR) spectrophotometer (Fisher Scientific Nicolet iS50, or equivalent). Diffuse reflectance infrared spectroscopy (DRIFTS) measurements were measured with a Pike DiffusIR accessory or equivalent.

Heat Flux and Thermal Conductivity Measurements

The aerogels were placed on a hot stage (Instec, or equivalent) with a high-precision temperature controller (Instec MK2000, or equivalent) in vacuum. The heat flux was measured with a heat flux sensor (greenTEG gSKIN XP 26 9C, or equivalent) covered with a blackbody absorber (Acktar Metal Velvet, or equivalent). The heat flux sensor was adhered to a copper mesa block which was actively maintained near room temperature using compressed air.

The thermal conductivity of the aerogels was measured using the transient plane source (TPS) method (Hot Disk TPS 2500 S, or equivalent) and Kapton sensors (Hot Disk Kapton 5465, or equivalent) with a heating power of 5 mW for a duration of 40 seconds. A correction factor associated with highly insulating materials was applied.

Emission Measurements

The aerogels were placed again placed on the hot stage (Instec, or equivalent) but with an infrared transparent KBr window instead of the copper block. Since the KBr lid cannot hold vacuum, the chamber was purged with pure nitrogen. An external port on the Fisher Scientific Nicolet iS50 FTIR was used to capture the emission. All experimental data was normalized to the response curve of a blackbody cavity.

Aerogel Structural Characterization

SEM/EDS maps and line-scans were collected using a TESCAN MIRA3 FEG SEM or equivalent. Aerogel cross-sections were prepared by creating a fracture surface near the middle of the aerogel after deposition. Nitrogen sorption measurements were taken using a Micromeritics ASAP 2020 Surface Area and Porosity analyzer or equivalent.

BET pore size distribution and surface area were measured using a Micromeritics ASAP 2020 Surface Area and Porosity analyzer or equivalent. Prior to analysis, the aerogel samples were degassed at 350° C. (achieved by a ramp of 20° C./min) for 8 hours. BET surface area analysis was conducted at 77 K using the amount of nitrogen adsorbed at various relative vapor pressures between 0.05<P/P0<0.3. Total pore volume measurements were taken at a relative vapor pressure, P/P0, of 0.995. Pore size distributions were calculated using the Barrett-Joyner-Halenda (BJH) method on the desorption branch of the isotherm.

The 3D profiles of aerogel samples were measured by focus variation microscopy55 using a Keyence VHS-700 digital microscope or equivalent. Prior to scanning, both sides of the aerogel were sanded using 2,500 grit SiC sanding paper (Grainger) or equivalent to make them flat and parallel. ALD $Al_2O_3$ density was measured using X-ray reflectivity (XRR) using a Rigaku SmartLab X-ray Diffractometer or equivalent. GlobalFit 2 Rigaku software version 2.0.10.0 or equivalent was used to analyze the data and extract the film density.

What is claimed:

1. A mesoporous oxide comprising:
   a porous oxide matrix comprising a porous oxide and having a surface area; and
   a metal oxide or metal nitride in the form of a conformal layer of the metal oxide or metal nitride on the surface of the porous oxide matrix, wherein the mesoporous oxide has a thickness in a range of about 0.5 mm to about 15 cm, the mesoporous oxide is amorphous, the conformal layer completely covers the surface area of the porous oxide matrix through a thickness of the porous oxide matrix, and wherein when the conformal layer comprises the metal oxide, the porous oxide is not the same as the metal oxide.

2. The mesoporous oxide of claim 1, wherein the porous oxide comprises a transparent porous oxide.

3. The mesoporous oxide of claim 1, wherein the porous oxide comprises silicon dioxide ($SiO_2$), aluminum oxide ($Al_2O_3$), chromium oxide ($Cr_2O_3$), tin dioxide ($SnO_2$), sodium oxide ($Na_2O$), calcium oxide (CaO), lithium oxide ($Li_2O$), magnesium oxide (MgO), zinc oxide (ZnO), manganese oxide (MnO), cobalt oxide (CoO) or a combination thereof.

4. The mesoporous oxide of claim 1, wherein the metal oxide or metal nitride comprises a transparent semiconductor or transparent conductor.

5. The mesoporous oxide of claim 1, wherein the metal oxide or metal nitride comprises aluminum oxide ($Al_2O_3$), indium oxide ($In_2O_3$), zinc oxide (ZnO), titanium dioxide ($TiO_2$), titanium oxide ($Ti_2O_3$), titanium nitride (TIN), tin dioxide ($SnO_2$), magnesium oxide (MgO), calcium oxide (CaO), hafnium dioxide ($HfO_2$), zirconium dioxide ($ZrO_2$), or a combination thereof.

6. The mesoporous oxide of claim 1, further comprising a mixed oxide material disposed between the porous oxide matrix and the metal oxide or metal nitride layer and comprising at least a portion of the porous oxide and at least a portion of the metal oxide.

7. The mesoporous oxide of claim 6, wherein the mixed oxide material comprises an amorphous ternary aluminum-silicon oxide material.

8. The mesoporous oxide of claim 1, further comprising metal oxide or metal nitride nanoparticles dispersed within the porous oxide matrix.

9. The mesoporous oxide of claim 8, wherein the volume fraction of the metal oxide or metal nitride nanoparticles in the mesoporous oxide is in a range of about 0.002% to about 5%, based on the total volume of the mesoporous oxide.

10. The mesoporous oxide of claim 8, wherein the metal oxide or metal nitride nanoparticles comprise an electrically transparent conductive oxide (TCO) material, an electrically transparent semiconductive oxide material, or a combination thereof.

11. The mesoporous oxide of claim 8, wherein the metal oxide or metal nitride nanoparticles have a localized surface plasmon absorption resonance at a wavelength in a range of about 2 to about 8 microns.

12. The mesoporous oxide of claim 1, having a porosity of about 30% to about 97%.

13. The mesoporous oxide of claim 1, having a Rosseland weighted absorption coefficient of about at least about 1 $cm^{-1}$.

14. The mesoporous oxide of claim 1, having a solar-weighted transmittance in a range of about 65% to about 99% over the AM1.5D standard spectrum.

15. The mesoporous oxide of claim 1 having a density of about 550 $kg/m^3$ or less.

16. The mesoporous oxide of claim 1, wherein the effective thermal emittance values arev about 0.3 to about 0.1 over a range of temperatures of about 550° C. to 700° C., as determined by the Heat Flux test.

17. A solar receiver, comprising:
   a solar absorber layer;
   a window layer; and
   a mesoporous oxide layer disposed between the solar absorber layer and the window layer, the mesoporous oxide layer comprising a porous oxide matrix and a metal oxide or a metal nitride, wherein the metal oxide or metal nitride is (1) in the form of a conformal layer of the metal oxide or metal nitride on the surface of the porous oxide matrix and the conformal layer completely covers the porous oxide through a thickness of the matrix, (2) in the form of metal oxide or metal nitride nanoparticles distributed throughout the porous oxide matrix, or (3) a combination of (1) and (2), wherein the mesoporous oxide layer is amorphous, and wherein when the conformal layer comprises the metal oxide, the porous oxide is not the same as the metal oxide.

* * * * *